United States Patent
Erickson et al.

(10) Patent No.: US 10,036,782 B2
(45) Date of Patent: Jul. 31, 2018

(54) BATTERY CONDITION DETECTION IN HAND HYGIENE PRODUCT DISPENSERS

(71) Applicant: Ecolab USA Inc., St. Paul, MN (US)

(72) Inventors: Joseph P. Erickson, Cloquet, MN (US); Viktor Slobodyan, Duluth, MN (US)

(73) Assignee: Ecolab USA Inc., St. Paul, MN (US)

( * ) Notice: Subject to any disclaimer, the term of this patent is extended or adjusted under 35 U.S.C. 154(b) by 0 days.

(21) Appl. No.: 15/215,183

(22) Filed: Jul. 20, 2016

(65) Prior Publication Data

US 2018/0024202 A1    Jan. 25, 2018

(51) Int. Cl.
*G01R 31/36*    (2006.01)
*G08B 21/18*    (2006.01)
*A47K 10/36*    (2006.01)

(52) U.S. Cl.
CPC ......... *G01R 31/3682* (2013.01); *A47K 10/36* (2013.01); *G01R 31/362* (2013.01); *G08B 21/182* (2013.01); *G01R 31/3606* (2013.01)

(58) Field of Classification Search
CPC ... G06F 1/3212; Y02B 60/1292; A47K 10/42; A47K 10/36; A47K 10/3625; G01R 31/3606; G08B 21/24
See application file for complete search history.

(56) References Cited

U.S. PATENT DOCUMENTS

| | | |
|---|---|---|
| 4,380,726 A | 4/1983 | Sado et al. |
| 4,839,597 A | 6/1989 | Rowland |
| 4,947,123 A | 8/1990 | Minezawa |
| 5,565,759 A | 10/1996 | Dunstan |
| 5,698,971 A | 12/1997 | Sahai et al. |
| 5,823,390 A | 10/1998 | Muderlak et al. |
| 6,467,651 B1 | 10/2002 | Muderlak et al. |
| 6,538,449 B2 | 3/2003 | Juncker et al. |
| 6,631,293 B2 | 10/2003 | Lyden |
| 6,870,349 B2 | 3/2005 | Cook |
| 6,950,683 B2 | 9/2005 | Hunt |
| 7,081,761 B2 | 7/2006 | Yurgil |

(Continued)

FOREIGN PATENT DOCUMENTS

| | | |
|---|---|---|
| EP | 2098878 A2 | 9/2009 |
| WO | 2014205283 A1 | 12/2014 |

OTHER PUBLICATIONS

International Search Report and Written Opinion of International Application No. PCT/US2017/042827, dated Oct. 27, 2017, 18 pp.

*Primary Examiner* — Mirza Alam
(74) *Attorney, Agent, or Firm* — Shumaker & Sieffert, P.A.

(57) ABSTRACT

Systems and methods for detection and analysis of battery condition information may be used with respect to, for example, battery powered hand hygiene product dispensers. The battery condition information may be used to identify potential low battery conditions, the type of dispenser, the type or form of product dispensed, and/or to detect occurrence of a battery replacement event in a hand hygiene product dispenser. The battery condition information may further be used to determine a number of dispenses remaining for a hand hygiene product dispenser. The battery condition information may further be used to provide battery condition information for battery operated hand hygiene product dispensers in hand hygiene compliance systems.

21 Claims, 12 Drawing Sheets

(56) References Cited

U.S. PATENT DOCUMENTS

| | | |
|---|---|---|
| 8,030,940 B2 | 10/2011 | Nishimoto |
| 8,096,445 B2 | 1/2012 | Yang et al. |
| 8,395,515 B2 | 3/2013 | Tokhtuev |
| 8,407,018 B2 * | 3/2013 | White .............. G01R 31/3679 702/179 |
| 8,489,348 B2 | 7/2013 | Shirriff et al. |
| 8,598,848 B2 | 12/2013 | Zheng et al. |
| 8,603,014 B2 | 12/2013 | Alleman et al. |
| 8,731,622 B2 | 5/2014 | Kanade et al. |
| 8,751,845 B2 | 6/2014 | Assad et al. |
| 8,766,643 B2 | 7/2014 | Thoren et al. |
| 8,783,511 B2 | 7/2014 | Snodgrass |
| 8,965,595 B2 | 2/2015 | Wegelin |
| 9,078,936 B1 | 7/2015 | Denby, Jr. |
| 9,117,361 B1 | 8/2015 | Hennigan et al. |
| 9,123,233 B2 | 9/2015 | Hermann |
| 2006/0175341 A1 * | 8/2006 | Rodrian .............. A47K 10/36 221/13 |
| 2010/0315243 A1 | 12/2010 | Tokhtuev et al. |
| 2010/0328076 A1 | 12/2010 | Kyle et al. |
| 2011/0163870 A1 | 7/2011 | Snodgrass |
| 2012/0317432 A1 * | 12/2012 | Assad .................. G06F 1/3212 713/340 |
| 2013/0025714 A1 * | 1/2013 | Hermann ............ G08B 21/245 137/551 |
| 2013/0099900 A1 | 4/2013 | Pulvermacher |
| 2013/0292411 A1 | 11/2013 | Bern |
| 2015/0022361 A1 | 1/2015 | Gaisser et al. |
| 2015/0134357 A1 | 5/2015 | Davis et al. |
| 2015/0199883 A1 * | 7/2015 | Hartley .............. A47K 5/1217 340/686.6 |
| 2015/0313422 A1 | 11/2015 | Ophardt et al. |
| 2016/0374519 A1 * | 12/2016 | Murphy .............. A47K 5/1217 222/23 |

* cited by examiner

BATTERY CONDITION DETECTION IN HAND HYGIENE PRODUCT DISPENSERS

TECHNICAL FIELD

The disclosure relates detection of battery conditions in battery-powered devices, such as hand hygiene product dispensers.

BACKGROUND

Compliance with hand hygiene guidelines is considered the most effective action health care workers can take to reduce pathogen transmission in health care settings. Despite this, hand hygiene compliance remains low, and improvement efforts tend to lack sustainability.

SUMMARY

In general, the disclosure relates to detection and analysis of battery conditions in battery-powered devices. For example, the battery condition detection techniques may be used for detection of low battery conditions and/or to provide battery condition information for battery operated hand hygiene product dispensers. The battery condition information may further be used to identify, for example, the type of dispenser, the type or form of product dispensed, and/or to detect occurrence of a battery replacement event. The battery condition information may further be used to determine a number of dispenses remaining for a hand hygiene product dispenser. The battery condition detection techniques may further be used to provide battery condition information for battery operated hand hygiene product dispensers in hand hygiene compliance systems.

In one example, the disclosure is directed to a system comprising a plurality of dispensers each configured to dispense a hand hygiene product, each dispenser configured to detect a dispense event and transmit a corresponding dispense event signal including dispenser identification information associated with the dispenser, each of the plurality of dispensers having an associated dispenser type and an associated dispensed product type; each of the plurality of dispensers further including one or more batteries configured to supply power to the dispenser; and a voltage sensor that senses voltage information correlated to a battery voltage provided by the one or more batteries; data storage media that stores low battery threshold data, the low battery threshold data including one or more low battery thresholds each corresponding to a dispenser type and a dispensed product type; and a computing device configured to receive the voltage information, the dispenser identification information, the dispenser type, and the dispensed product type, the computing device further configured to identify one of the one or more low battery thresholds based on the dispenser type and the dispensed product type, the computing device further configured to detect a low battery condition if the voltage information satisfies the identified low battery threshold.

In another example, the disclosure is directed to a system comprising a hand hygiene product dispenser associated with one of plurality of dispenser types and configured to dispense a hand hygiene product, the hand hygiene product dispenser including one or more batteries configured to supply power to the dispenser; and a voltage sensor that senses voltage information correlated to a battery voltage of the one or more batteries; the hand hygiene product dispenser configured to transmit dispenser data including dispenser identification information associated with the dispenser, the associated one of the plurality of dispenser types, and the voltage information; data storage media that stores a plurality of low battery thresholds each corresponding to one of a plurality of dispenser types; and a computing device configured to receive the dispenser data, the computing device further configured to identify one of the plurality of low battery thresholds based on the one of the plurality of dispenser types associated with the dispenser, the computing device further configured to detect a low battery condition if the voltage information satisfies the identified low battery threshold.

In another example, the disclosure is directed to a system comprising a hand hygiene product dispenser including one or more batteries configured to supply power to the dispenser; and a voltage sensor that senses voltage information correlated to a battery voltage of the one or more batteries; the hand hygiene product dispenser configured to transmit the voltage information; data storage media that stores one or more low battery thresholds each corresponding to a dispenser type, and that stores a plurality of discharge profiles each corresponding to one of a plurality of dispenser types; and a computing device configured to receive the voltage information and identify one of the plurality of discharge profiles based on the voltage information received from the dispenser; the computing device further configured to identify the dispenser type corresponding to the identified discharge profile.

In another example, the disclosure is directed to a system comprising a hand hygiene product dispenser, the dispenser defined by one of a plurality of dispenser types and including one or more batteries configured to supply power to the dispenser; and a voltage sensor that senses voltage information correlated to a battery voltage of the one or more batteries; the hand hygiene product dispenser configured to transmit dispenser data including the voltage information and dispenser identification information including the defined one of the plurality dispenser types; data storage media that stores one or more discharge profiles each corresponding to one of the plurality of dispenser types and one of a plurality of dispensed product types; and a computing device configured to receive the voltage information and the dispenser identification information, the computing device further configured to identify one of the plurality of discharge profiles based on the voltage information and the defined one of the plurality of dispenser types; the computing device further configured to identify the dispensed product type corresponding to the identified discharge profile.

The details of one or more examples are set forth in the accompanying drawings and the description below. Other features and advantages will be apparent from the description and drawings, and from the claims.

DETAILED DESCRIPTION

In general, the disclosure relates to detection and analysis of battery conditions in battery-powered devices. For example, the battery-powered devices may include hand hygiene product dispensers, which may in turn be part of a hand hygiene compliance system. The hand hygiene compliance system may monitor, analyze and report on hand hygiene compliance at a hospital or other healthcare facility, at a restaurant or other food service facility, or at any other location or environment where monitoring of hand hygiene compliance is desired. For purposes of illustration, the example battery condition detection techniques will be described with respect to battery-powered hand hygiene product dispensers. However, it shall be understood that the techniques described herein may be used for any battery-powered device, and that the disclosure is not limited in this respect.

Figure 1:
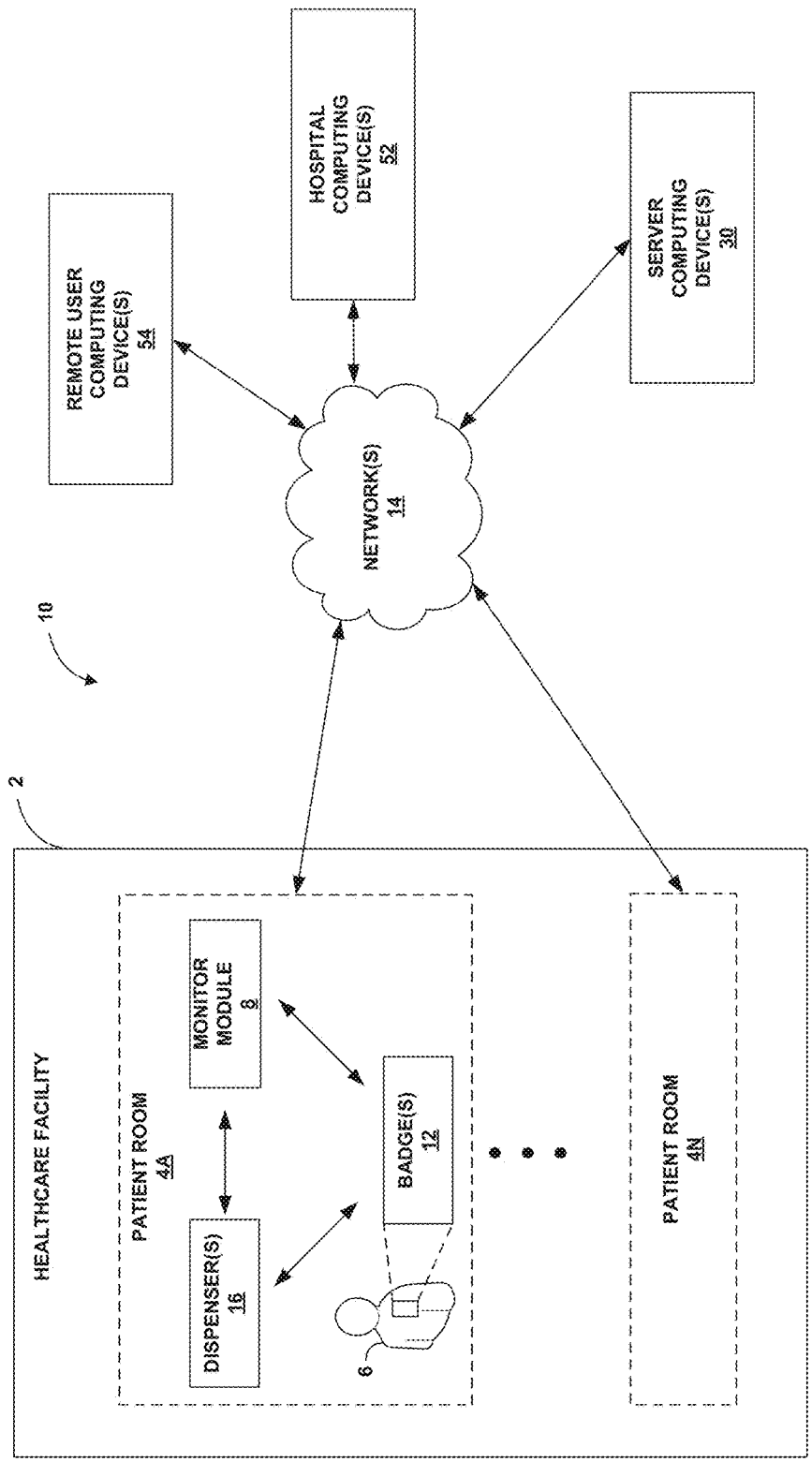
FIG. 1 is a block diagram illustrating an example hand hygiene compliance system in which the battery condition detection techniques of the present disclosure may be used.

FIG. 1 is a block diagram illustrating an example hand hygiene compliance system 10 in which the battery condition techniques of the present disclosure may be used. FIG. 1 shows a healthcare facility 2 including a plurality of patient rooms or other defined areas 4A-4N. In this example, each room or area 4A-4N is associated with one or more hand hygiene product dispensers 16 and at least one monitor module 8. The system 10 further includes a plurality of identification badges 12, each uniquely associated with a different one of a plurality of healthcare worker (HCW) 6. Each monitor module 8 communicates with a local hospital computing device(s) 52, remote or local server computing devices 30 and/or with remote user computing device(s) 54 via one or more network(s) 14. Computing devices 30, 52, and 54 may include, for example, one or more of a server computing device, desktop computing device, laptop computing device, a mobile computing device (such as a smart phone, personal digital assistant, pager, etc.) or any other computing device. Network(s) 14 may include, for example, one or more of a dial-up connection, a local area network (LAN), a wide area network (WAN), the internet, a wireless or Wi-Fi network, a cell phone network, satellite communication, or other means of electronic communication. The communication may be wired or wireless.

Although certain examples are shown and described herein, it shall be understood that the dispensers, monitor modules, badges, and other components deployed in any particular hand hygiene system may vary depending upon the number and location of rooms and other defined spaces within the hospital, the number and location of dispensers, the communication ranges of the devices, their power requirements, etc. It shall be understood, therefore, that the number of dispensers, monitor modules, badges, etc., may vary depending upon the facility and the particular system implementation and that the disclosure is not limited in this respect.

In general, hand hygiene compliance system 10 detects entry/presence of persons in a patient room (or other defined area), identifies those persons and collects data concerning their hand hygiene behavior. To that end, each monitor module 8 is configured to detect entry and/or presence of a person in the associated patient room or area (hereinafter referred to for simplicity as "room" or "patient room"). Monitor module 8 may further include a tag reader (not shown in FIG. 1) that is activated when entry of a person into the room is detected. This is referred to as an "entry event." ID badge 12 includes electronic circuitry (such as an RFID chip and antenna) that stores and communicates HCW identification information when interrogated by the reader. The entry or presence information, such as time and date stamp, and the HCW identification information may be transmitted from badge 12 to monitor module 8. Alternatively, if the person entering the room is not an HCW and does not have an associated id badge, monitor module 8 may store the entry information along with data identifying the person associated with the detection as a non-HCW.

Upon receipt of the entry and identification information, monitor module 8 may send a "wake-up" signal to dispensers 16. This wake-up signal may cause dispensers 16 to enter an "invitation mode", in which the dispenser activates one or more visual or audible indicators whose purpose is to remind the person entering the room of a so-called hand hygiene opportunity. In some examples, dispensers 16 may receive such wake-up signal directly from monitor module 8.

Each dispenser 16 includes an activation sensor that detects when a hand hygiene product is dispensed. This is referred to as a "dispense event." For example, an activation sensor may detect when a dispenser button or bar is pushed or pulled to dispense hand hygiene product, may detect when an infrared or other touchless dispenser detects presence of a user, may detect the actual dispensing of the hand hygiene product, or may detect some other activation mechanism for dispensing hand hygiene product. Each time the activation sensor determines that dispenser 16 has dispensed hand hygiene product, the dispenser records a dispense event and attempts to identify a HCW badge signal within range of the dispenser reader. If a badge responds with its badge ID, the dispenser may associate that badge ID with the dispense event. If no badge ID is detected, the system may associate the dispense event as being associated with a non-HCW or other badgeless person.

The dispenser may use one or more of several techniques to obtain the HCW identification information from a target id badge 12, and/or to ensure that the correct HCW identification information associated with the dispense event is isolated in the event that two or more tags respond. The HCW identification information associated with the dispense event, and any other relevant and/or available dispenser data regarding the dispense event, such as dispenser id, product name, time, date, etc., may be stored by the dispenser as dispenser data. In addition to data regarding a dispense event (time and date stamp, dispenser id, HCW id, etc.) the dispenser data transmitted by dispenser(s) 16 may also include status data such as dispenser battery voltage, detection range, hand hygiene product, number of dispenses, out-of-product status, etc. The detected dispenser battery voltage, may be further analyzed, either alone or in conjunction with other data, as described herein to identify, among other things, potential low battery conditions, or to determine other information concerning the dispensers at the facility as will be further described herein. Each dispenser 16 may transmit its dispenser data to the associated monitor module 8. Dispenser(s) 16 may transmit dispenser data at predefined periodic intervals, upon completion of each dispense event, and/or upon request.

Monitor module 8 collects the hand hygiene data from each of dispensers 16 in the associated room 4A. In some examples, monitor module 8 is AC powered and is continuously available to receive information from the associated dispensers 16. In other examples, monitor modules 8 may be battery powered, and may include sleep and wake modes, other battery conservation techniques, to conserve battery power. Monitor modules 8 may communicate the dispenser data and/or entry event data, for example, to one or more local hospital computing device(s) 52, one or more remote user computing device(s) 54, or one or more server computing device(s) 30 via network(s) 14.

System 10 may attempt to identify "hand hygiene opportunities" occurring throughout facility 2. For example, each entry event may be defined as a hand hygiene opportunity. In other words, an entry event likely corresponds to the detected HCW being in close proximity to a patient, meaning the HCW should perform a desired hygiene action, such as washing their hands upon entering the detected area. As another example, entry/presence of a HCW in a bathroom associated with the patient room may be defined as a hand hygiene opportunity. As another example, entry/presence of a HCW near a patient bed may be defined as a hand hygiene opportunity. As another example, leaving a bathroom, patient room, or area around a patient bed may be defined as a hand hygiene opportunity. It shall be understood that system 10 may define other relevant hand hygiene opportunities for purposes of monitoring compliance with hand hygiene procedures, and the disclosure is not limited in this respect.

System 10 may further attempt to reconcile each hand hygiene opportunity with a corresponding dispense event; that is, system 10 may determine whether each person presented with a hand hygiene opportunity completed an associated dispense event. A hand hygiene opportunity and a dispense event correspond when the same person initiated both the hand hygiene opportunity and the dispense event. This occurs when the same HCW identification information is associated with both the hand hygiene opportunity and the dispense event. This may also occur when the hand hygiene opportunity and the dispense event are associated with non-HCW identification information.

If a dispense event corresponding to a hand hygiene opportunity is detected, a "compliant hand hygiene event" may be recorded. If a hand hygiene opportunity is detected and no corresponding dispense event is detected, system 10 may record a "non-compliant hand hygiene event." For example, computing device(s) 52 may determine whether a dispense event corresponding to a hand hygiene opportunity is detected within a target time frame. The target time frame may be determined based on a reasonable amount of time for the identified person to completing the desired action (such as a dispense event), but not be so long as to result in a likelihood that the person associated with the hand hygiene opportunity comes into contact with the patient without completing the desired action. Target time frames may be in the range of 5 to 30 seconds, for example, but other time frames may be used and the disclosure is not limited in this respect.

A remote computing device 30 may communicate with the local computing device(s) 52 via network(s) 14 to receive the data related to hand hygiene compliance that is gathered and stored on local computing device(s) 52 at each hospital. Server computing device(s) 30 may also send commands, instructions, software updates, etc. for the hand hygiene compliance systems, dispensers, monitor modules, badges, and/or other system components at each hospital via network(s) 14. Server computer 30 may receive data or otherwise communicate with the hand hygiene compliance systems at each of the facilities 2 on a periodic basis, in real-time, upon request of server computer 30, or at any other appropriate time.

Computing device(s) 30, 52, and/or 54 may include analysis and reporting applications that analyze the hand hygiene data and generate reports regarding hand hygiene compliance. For example, computing device(s) 30, 52 and/or 54 may analyze the hand hygiene data to monitor hand hygiene compliance by individual HCW, type of HCW (e.g., nurses, doctors, environmental services (EVS), etc.), individual departments, type of department, individual hospital, type of hospital, across multiple hospitals or facilities, or by various other selected parameters. Computing device(s) 30, 52 and/or 54 may generate a variety of reports to provide users local to each facility 2 or remote users 54 with both qualitative and quantitative data regarding hand hygiene compliance at their facility, to compare data over time to determine whether improvement with compliance with hand hygiene procedures has occurred, and/or to benchmark hand hygiene compliance at multiple hospitals or other healthcare facilities. For example, the computing device(s) 30, 52, and/or 54 may analyze the hand hygiene data to monitor hand hygiene compliance by individual HCW, type of HCW (e.g., nurses, doctors, environmental services (EVS), etc.), individual departments, type of department, individual hospital, type of hospital, across multiple hospitals or facilities, or by various other selected parameters. The system may generate a variety of reports to provide users local to each hospital 22A-22N or remote users 54 with both qualitative and quantitative data regarding hand hygiene compliance at their hospital, to compare data over time to determine whether improvement has occurred, and/or to benchmark hand hygiene compliance at multiple hospitals or other healthcare facilities.

Badges 12 may be active, passive or semi-active tags. For example, badges 12 may periodically generate a tag signal containing, for example, the HCW identification information, badge battery voltage, etc., at intervals such as 0.5 seconds, 1 second, 2 seconds, 5 seconds or other appropriate time interval. As another example, badges 12 may continuously transmit a tag signal containing the HCW identification information. As another example, badges 12 may be passive tags which generate a tag signal containing the HCW identification information when induced by an interrogation signal, such as a signal from a dispenser 16 upon detection of a dispense event, or from monitor module 8 upon detection of an entry event, etc.

Figure 2:
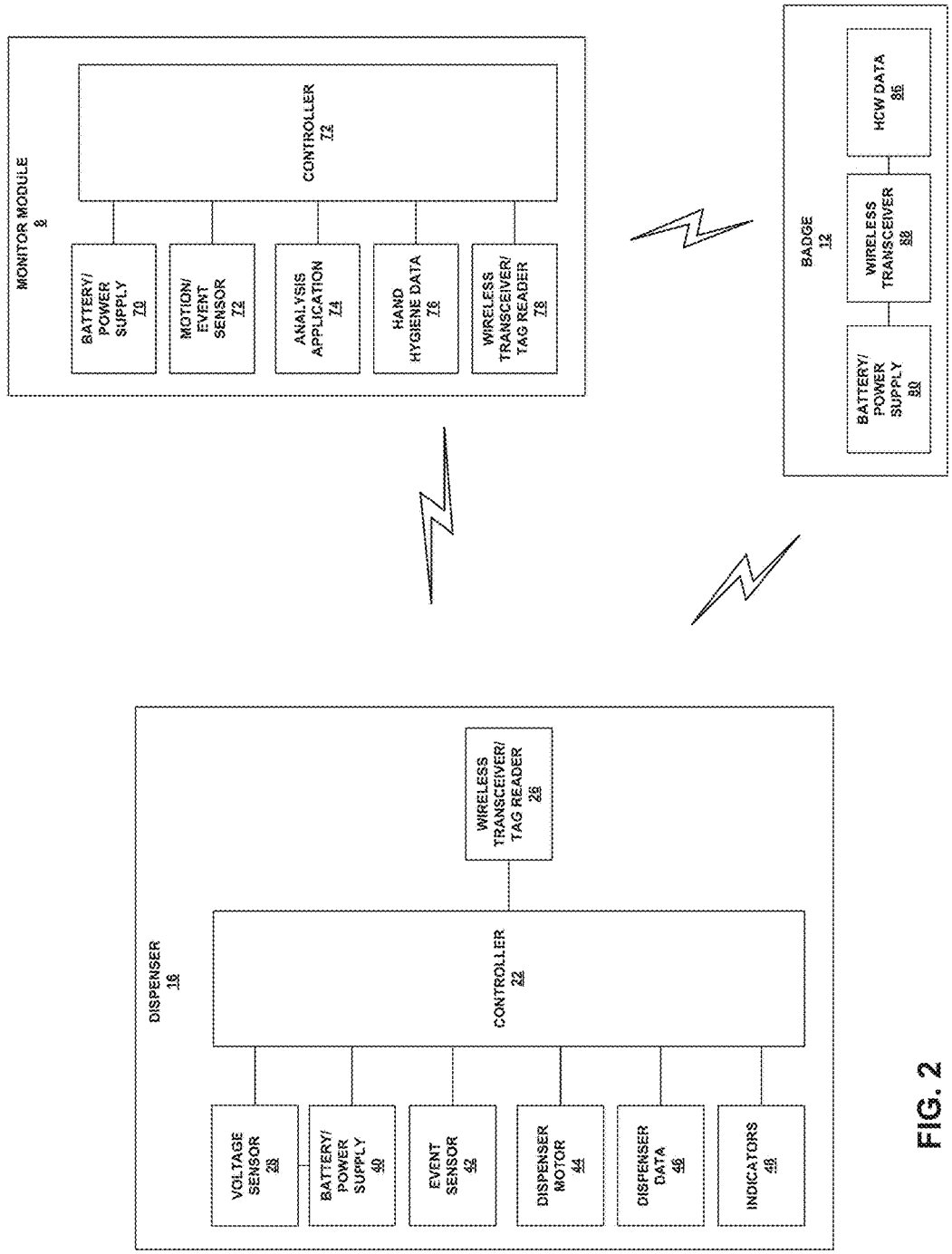
FIG. 2 is a block diagram illustrating electronic components of an example dispenser, an example monitor module, and an example badge.

FIG. 2 is a block diagram illustrating the electronic components of an example battery-powered dispenser 16, an example monitor module 8, and an example badge 12. Dispenser 16 includes a controller 22, a battery/power supply 40, a voltage sensor 28, an activation/event sensor 42, a dispenser motor 44, one or more indicators 48, and a wireless transceiver 26. Dispenser 16 may also include dispenser data storage 46 for storing dispenser data received, generated, or used by dispenser 16.

Activation/event sensor 42 detects dispensation of a hand hygiene product. This is referred to as a "dispense event." For example, activation sensor 42 may detect actuation of the dispenser by a user to dispense hand hygiene product. Activation sensor 42 may include an electronic switch that senses actuation of the dispenser by a user, such as pushing or pulling of a button or bar to dispense hand hygiene product. In another example, activation sensor 42 may include an infrared or other touchless sensor that detects presence of a user's hands or other actuation by a user. In another example, rather than detecting actuation by a user, activation sensor 42 may detect the actual dispensing of the hand hygiene product.

Each time activation sensor 42 detects a dispense event, dispenser 16 may, in some examples, attempt to identify the person responsible for initiating the dispense event. To do this, dispenser 16 looks for a signal from a badge 12 within range of the dispenser transceiver 26. Dispenser 16 includes wireless transceiver 26 that provides for wireless communication between a badge 12 and dispenser 16, and also for wireless communication between dispenser 16 and monitor module 8. A signal received from a detected badge 12 contains HCW identification information that uniquely identifies the person to whom the badge is assigned. In the case of activation by a non-HCW such as a patient, visitor, or any person not wearing a badge, the dispenser 16 will not detect a badge within range. Dispenser 16 may record the dispense event as a non-HCW dispense event if no ID badge data is detected.

Dispenser 16 may use one or more of several techniques to obtain the HCW identification information from a target badge 12, and/or to ensure that the correct HCW identification information associated with the dispense event is isolated in the event that two or more badges respond. The dispenser data, including the associated HCW identification information and any other relevant dispense event information regarding the dispense event, such as dispenser id, product name, product type, time, date, etc., may be stored in dispenser data 46. Other dispenser status information determined at the time of or upon completion of the dispense event, such as battery voltage, number of dispenses, out-of-product status, etc. may also be stored along with the dispense event information as dispenser data 46. Voltage sensor 28 senses the voltage of dispenser battery/power supply 40. The voltage information sensed by voltage sensor 28 may be included in the dispenser data for each dispense event. The dispenser data is communicated to the monitor module 8, which further forwards the voltage information to the hospital computing devices 52 and/or the server computing device 30 for analysis and detection of a possible low battery condition of the dispenser 16. The dispenser data concerning the dispense event may be transmitted to monitor module 8 via communication between, for example, wireless transceiver 26 and wireless transceiver 78. The dispenser data may be transmitted, for example, after each detected dispense event, at periodic intervals, or upon request of monitor module 8.

In some examples, voltage sensor 28 may be implemented using an ADC (analog-to-digital) voltage sensing circuit that measures the analog voltage of battery/power supply 40 and converts the voltage to a digital value within a specified range. For example, for a 10-bit analog-to-digital converter, the detected analog voltage may be converted to a digital value in the range of 0-1023, where 0 is equivalent to 0.0 Volts and 1023 is equivalent to a maximum voltage. It shall be understood that this resolution is an example only, and that the resolution of the ADC may be chosen such that the transition to a low-battery condition may be accurately detected.

Dispenser indicators 48 may include audible or visual status indicators for indicating battery status, remaining product status, invitation mode, or other relevant dispenser status information. For example, an audible and/or visual indicator may be activated when a low battery condition is detected. As another example, an audible and/or visual indicator may be activated when the amount of hand hygiene product in the dispenser is low or is depleted. In some examples, dispenser indicators 48 may, in response to detection of a HCW badge within the patient room or other defined area, present an audible and/or visual "invitation" to initiate a hand hygiene dispense event. The "invitation" may serve to remind or alert a HCW to a so-called hand hygiene opportunity; that is, an opportunity to initiate a hand hygiene dispense event and thus help to increase compliance with hand hygiene protocols for the healthcare facility.

Example monitor module 8 includes a battery/power supply 70, a motion/event sensor 72, a wireless transceiver 78, and a controller 72. Monitor module 8 may further include hand hygiene data storage 76 that stores data concerning hand hygiene events associated with that monitor module and/or the associated patient room. Monitor module 8 may further include an analysis application 74 which, when executed by controller 72, allows controller to detect entry of HCW into a patient room or other defined area, identify HCWs present within the associated patient room or other defined area, identify hand hygiene opportunities associated with the patient room, track hand hygiene events occurring at each dispenser associated with the monitor module, and receive voltage information concerning the battery/power supply for each associated dispenser.

Each badge 12 includes a battery/power supply 80, a wireless transceiver 88 (such as an RFID chip and antenna) and data storage 86 that stores and communicates HCW identification information when interrogated by the wireless transceiver 78 of monitor module 8 and/or wireless transceiver 26 of dispenser 16. Alternatively, if the person entering the room is not an HCW and therefore does not have an associated badge, the entry event information and information identifying the person as a non-HCW may also be stored in hand hygiene data 76.

Each time a HCW enters a room, monitor module 8 may count and store the entry event as a "hand hygiene opportunity." In monitoring and tracking hand hygiene opportunities, the system is able to analyze the actual number of dispense events along with the number of hand hygiene opportunities so that compliance with hand hygiene protocols may be monitored.

Upon receipt of the entry and identification information, monitor module 8 may send a "wake-up" signal to dispensers 16. This wake-up signal may cause dispensers 16 to enter an "invitation mode", in which the dispenser activates one or more visual or audible indicators whose purpose is to remind the person entering the room of a hand hygiene opportunity. In some examples, a dispenser receives the wake-up signal directly from monitor module 8. In another example, monitor module 8 may send a "reminder" signal to the badge 12, which may cause the badge to activate one or more visual or audible indicators on the badge itself to remind the HCW entering the room of a hand hygiene opportunity.

Monitor module 8 receives entry event data from motion sensor 72, receives dispenser data from each of dispensers 16 in the associated room, and stores the entry event data and dispense event data in hand hygiene data storage 76. The data for each entry or dispense event may also include time and date stamps, HCW id information, room/area identifier, dispenser battery voltage readings, and any other data relevant to monitoring and analysis of hand hygiene compliance. In some examples, monitor module 8 is battery powered and may normally be in a "sleep" mode until detection of an entry event by motion sensor 72 causes monitor module 8 to "wake up." In other examples, monitor module 8 is AC powered and constantly turned ON and ready to receive information from motion sensor 72 and dispensers 16. As described above with respect to FIG. 1, each monitor module 8 may communicate with a local hospital computer 52 over one or more networks 14.

Figure 3:
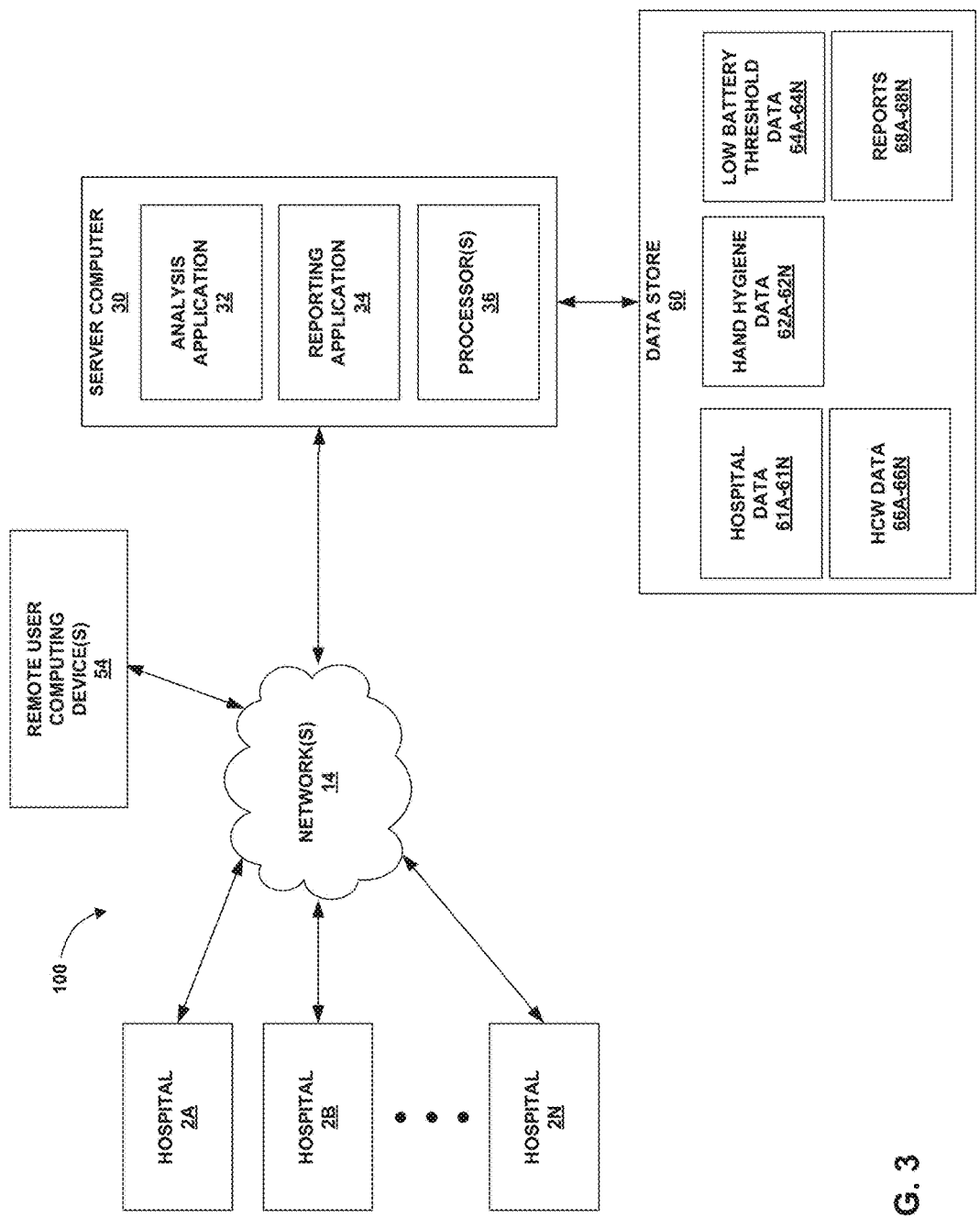
FIG. 3 is a block diagram illustrating an example communications environment in which the battery condition detection techniques of the present disclosure may be used.

FIG. 3 is a block diagram illustrating an example environment in which the battery condition detection techniques of the present disclosure may be used. One or more hospitals or other healthcare facilities 2A-2N each include a plurality of associated dispensers, monitor modules, and HCW badges 12 as shown in FIG. 1. The computing devices at each of the healthcare facilities 2A-2N are coupled via network(s) 14 to server computing device(s) 30. Server computing device(s) 30 is coupled to a local server computer at each of the healthcare facilities 2A-2N via network(s) 14 to receive data related to hand hygiene compliance that is gathered and stored on local storage media at each hospital. Server computing device(s) 30 may also send commands, instructions, software updates, etc. to each hospital computing device, dispensers, monitor modules, badges, and/or other system components via network(s) 14. Server computing device(s) 30 may receive data or otherwise communicate with the healthcare facilities on a periodic basis, in real-time, upon request of server computer 30, or at any other appropriate time.

The data received from each of the healthcare facilities 2A-2N, as well as other data associated with the operation of the hand hygiene compliance system, may be stored on a database 60. Database 60 may store, for example, hospital data 61A-61N associated with each of the healthcare facilities 2A-2N, respectively; hand hygiene data 62A-62N associated with each of the healthcare facilities 2A-2N, respectively; low battery threshold data 64A-64N associated with each of the healthcare facilities 2A-2N, respectively; health care worker data 66A-66N associated with each of the healthcare facilities 2A-2N, respectively; and reports 68A-68N associated with each of the healthcare facilities 2A-2N, respectively.

Hospital data 61A-61N may include data that uniquely identifies or is associated with the respective hospital or other healthcare facility 2A-2N. As such, hospital data 61A-61N may include, for example, hospital identification information, employee information, management information, accounting information, business information, pricing information, information concerning those persons or entities authorized to access the reports generated by the hand hygiene compliance system, date and time stamps, caregiver identification, visitor identification and additional information relating to other aspects of the corporation or operation and other information specific to each individual healthcare facility 2A-2N. Hospital data 61A-61N may further include a list of patient room(s) or other defined area(s) within the hospital; monitor module ids; dispenser ids; HCW ids; associations between hand hygiene dispensers, monitor modules, and patient rooms or other defined area; and any other relevant data concerning the respective healthcare facility 2A-2N.

Hand hygiene data 62A-62N may include, for example, any information associated with operation of the hand hygiene product dispensers, including associated entry event information detected by the monitor modules in the respective healthcare facility 2A-2N. For example, hand hygiene data 62A-62N may include, without limitation, one or more of the following data types: dispenser id; dispenser type; dispensed product name; dispensed product type (e.g., sanitizer, soap, lotion, alcohol-based hand hygiene product, etc.); dispensed product form (liquid, foam, gel, powder, pelleted, etc.); dispensed product amounts (by volume, weight, or other measure); dispensing times, dates, and sequences; detected healthcare worker ids linked to specific dispensing events; dispenser battery voltage information; and any other information originating at the dispenser site, whether detected by a dispenser, by a monitor module, by a dispenser communication module, a badge, or by an associated device.

Low battery threshold data 64A-64N may include, for example, information concerning one or more low battery thresholds associated with one or more hand hygiene product dispensers. Each low battery threshold may correspond to one or more of the following features or characteristics: dispenser types, battery type, dispensed product names, dispensed product types (sanitizer, soap, lotion, alcohol-based hand hygiene product, etc.), dispensed product forms (liquid, foam, gel, powder, pelleted, etc.), or any other feature or characteristic that may affect the low battery threshold for one or more dispensers. In some examples, the low battery thresholds may be empirically determined based on measurements made on different types of dispensers, different types of batteries, different types of products, different forms of products, or other feature or characteristic.

Healthcare worker (HCW) data 66A-66N may include, for example, information concerning employees of the respective healthcare facility 2A-2N. For example, HCW data 66A-66N may include, without limitation, HCW name, employee id number and/or other identification information; position (physician, nurse, physician assistant, physical therapist, EVS, etc.); work schedule; and other HCW related information for the healthcare workers in the respective healthcare facility 2A-2N.

Server computing device(s) 30 includes an analysis application 32 that may analyze the data received from each of healthcare facilities 2A-2N and stores the results for each healthcare facility 2A-2N in the database 60. Analysis application 32 may analyze the hospital data 61A-61N, hand hygiene data 62A-62N, low battery threshold data 64A-64N, and HCW data 66A-66N, either alone or in various combinations with each other to monitor hand hygiene compliance in a healthcare facility or other facility in which monitoring of hand hygiene compliance may be desired. For purposes of the present disclosure, analysis application 32 may further analyze the dispenser voltage information received for one or more of the dispensers 16 along with low battery threshold data 64A-64N to detect low battery conditions in one or more dispensers 16. The analysis application may further analyze the low battery threshold data and the low battery information in the hand hygiene data 62A-62N to determine whether any of the low battery thresholds need to be revised or updated. Alternatively, or in addition, analysis application 32 may further analyze the dispenser voltage information received for one or more of the dispensers 16 along with low battery threshold data 64A-64N to identify a dispenser type, a dispensed product type or form, a battery type, a number of dispenses remaining, a battery replacement event, etc.

A reporting application 34 generates a variety of reports that present the analyzed data for use by the person(s) responsible for overseeing hand hygiene compliance at each healthcare facility 2A-2N. Reporting application 34 may generate a variety of reports to provide users local to each healthcare facility 2A-2N or remote users 54 with both qualitative and quantitative data regarding hand hygiene compliance at their hospital, and/or battery-related conditions of any dispensers 16 in the healthcare facility.

Reports 68A-68N associated with each healthcare facility 2A-2N, respectively, may be stored in database 60. Reports 68A-68N may be accessed by users local to each healthcare facility 2A-2N or by remote users 54 over one or more network(s) 14. One or more of the reports 68A-68N may be downloaded and stored on a local hospital computer 52, remote user computing device(s) 54, other authorized computing device, printed out in hard copy or further communicated to others as desired.

In some examples, local hospital computing device 52 may also store the above-described hand hygiene data (e.g., hospital data, dispenser data, motion detector data, HCW data, and/or coordinator data) associated with that hospital. Hospital computing device 52 may also include local analysis and reporting applications such as those described above with respect to analysis and reporting applications 32 and 34. In that case, reports associated with that particular hospital may be generated and viewed locally, if desired. In another example, all analysis and reporting functions are carried out remotely at server computer 30, and reports may be viewed, downloaded or otherwise obtained remotely. In other examples, some healthcare facilities 2A-2N may include local storage and/or analysis and reporting functions while other healthcare facilities 2A-2N rely on remote storage and/or analysis and reporting. Thus, although the general case of data being stored at the local hospital computing device 52 and analysis/reporting being carried out by the server computing device 30 is described herein, it shall be understood that these storage, analysis and reporting functions may also be carried out locally or at some other location, and that the disclosure is not limited in this respect.

Reporting application 34 may generate a variety of reports based on the hand hygiene data from one or more rooms with in a healthcare facility or from multiple healthcare facilities. These reports may include, for example, detailed analysis and reporting on key metrics, including hand hygiene compliance by individual HCW, type of HCW (nurses, doctors, EVS, etc.), room, department, type of department, individual hospital, across multiple hospitals, etc. The reports may benchmark current hand hygiene practices across the entire database, across hospitals or other healthcare facilities. The reports may include trending of various key metrics over time, identify particular problem areas (e.g., individual HCW or types of HCW having unsatisfactory hand hygiene compliance) provide actionable improvement plans and assess current practices relative to best hand hygiene practices.

Other reports that may be generated may include, for example, summary reports for an entire hospital or other healthcare facility; the total number of dispense events per dispenser over a defined period of time; the total compliance percent for all HCWs by patient room or other defined area, by department, by hospital, or across multiple hospitals or facilities; baseline compliance thresholds by individual HCW, type of HCW, by department, by hospital, or multiple hospitals or facilities; reports comparing highest, lowest and/or average percentage compliance by any of these breakdowns; reports comparing highest, lowest and/or average number of dispense events per dispenser or per HCW; trending data showing past, present and projected future hand hygiene compliance. The reports may indicate whether the number of dispense events per dispenser, per room, per individual HCW, per HCW type, per department, per hospital etc. is within acceptable limits and whether it met specified targets for dispense events for each of these parameters.

Reporting application 34 may permit a user to select a particular format (text, graphs, tables, combinations thereof, etc.); select by data type (dispenser data, hospital data, motion detector data, HCW data, coordinator data, etc.); select by date; select by individual HCW type of HCW, department, hospital or multiple hospitals or facilities; select by percent compliance; select for example, by highest, lowest or average compliance; or to create and generate reports based on nearly any data collected and stored by hand hygiene compliance system.

The reports may highlight particular problems areas where hand hygiene compliance thresholds are not being met. For example, the reports may identify certain individual HCWs, types of HCWs, departments or hospitals having hand hygiene compliance below a specified threshold. This information can help to identify where additional training or corrective action may be necessary.

The reports may also provide a summary of recommended next steps that the hospital may take to improve their hand hygiene compliance results in the future. For example, suggested next steps may be given for continuous improvement and education directed toward individual HCWs or types of HCWs, operational processes, hand hygiene outcome efficiency, etc.

For purposes of the present disclosure, reporting application 34 may further generate a low battery condition message or alert for one or more dispensers, reports summarizing battery usage or voltage levels over time (e.g., such as predicted battery usage versus actual battery usage), battery change data (dates, frequency, etc.), battery cost, voltage information received for each dispenser over time, battery voltage information by product name, product type, or dispenser type, etc. The battery condition information may be reported by dispenser, by patient room, by facility, etc.

Figure 4:
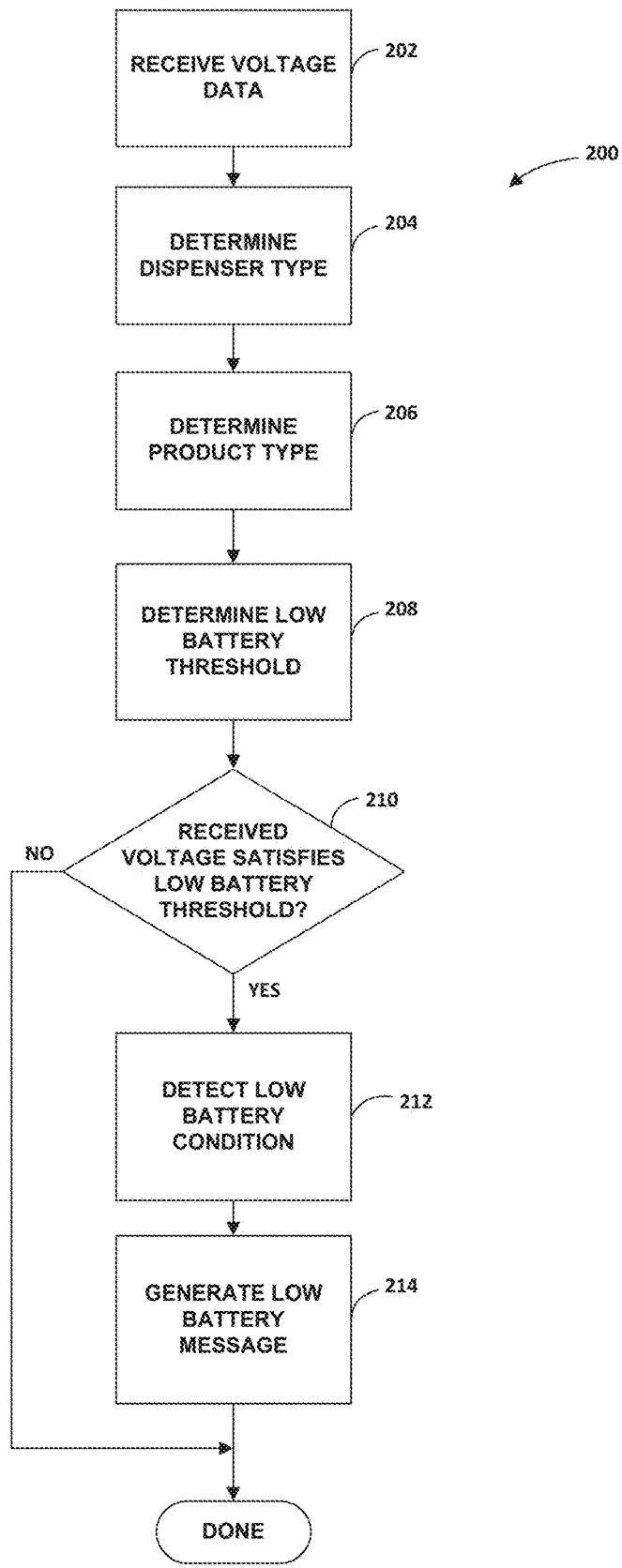
FIG. 4 is a flowchart illustrating an example process by which a computing device may detect a low battery condition of a hand hygiene product dispenser.

FIG. 4 is a flowchart illustrating an example process (200) by which a computing device, such as computing devices 30, 52, and/or 54 executing an analysis application 34 such as that shown in FIG. 3, may analyze voltage information received for a battery-powered dispenser and detect a low battery condition. In general, the computing device may receive voltage information associated with the actual dispenser battery voltage. To detect a low battery condition, the system described herein may compare the received voltage information with a pre-defined "low battery threshold." Voltage information that that satisfies the low battery threshold may qualify as a "low battery condition."

The system may generate a low battery message to alert hospital personnel of a potential low battery condition. The low battery condition message may include dispenser identifying information, patient room/area information, current dispenser battery voltage information, the number of dispenses remaining at the current battery voltage level, recommended battery servicing intervals, the dispensed product name or type, current and/or replacement battery information (such as battery type, number of batteries, battery voltage, brand, etc.), and/or any other relevant information concerning the potential low battery condition.

The low battery condition message may be sent to one or more of computing devices 30, 52, or 54. The low battery condition message may be in the form of an electronic mail (email) message, voicemail message, text message, alert, notification, audible or visual indicator, or other means of electronic communication. Alternatively, or in addition, the low battery message may be included in a report generated by the system, such as in a field of a spreadsheet, indicated on a graph, printed in text, etc. The alert may be audible, visual, or both. Low battery alerts may be generated and sent to a user at the time of detection, and/or low battery alerts for a period of time may be aggregated into a single report or notification. For example, a daily or weekly report may be generated including all potential low battery conditions detected for that time period. The low battery threshold may be set to account for the length of time between low battery alert messages. Alternatively, or in addition, the system may activate one or more of indicators 48 on dispenser 16 (see FIG. 2) to indicate a low battery condition.

The low battery threshold may vary depending on one or more factors. For example, certain factors associated with the particular dispenser and/or the product dispensed may affect the amount of energy (and thus the amount of battery voltage) required to initiate and/or complete a dispense event. These factors may include, but are not limited to, the dispenser type (touch-free, type of pump, etc.), dispensed product names, dispensed product types (sanitizer, soap, lotion, alcohol-based hand hygiene product, etc.), dispensed product forms (liquid, foam, gel, powder, pelleted, etc.), battery type, or any other factor that may affect the amount of energy required to initiate and/or complete a dispense event, and that thus may affect the low battery threshold for a particular dispenser.

For example, dispensing of a foam may require more energy (and hence require a larger battery voltage remaining and/or result in a relatively larger drain in battery voltage) than dispensing of a gel or a liquid. As a result, the low battery threshold when dispensing a foam may need to be relatively higher than the low battery threshold for the same dispenser when dispensing a gel or a liquid. As another example, the type of dispenser (e.g., the mechanics of the pump design, the type of motor and/or the touch free sensor, etc.) may also affect the amount of energy required to perform a dispense. As a result, certain types of dispensers may require relatively higher or lower low battery thresholds than other types of dispensers. Factors may also include the dispensed product name, the dispensed product type, the dispensed product form, or any other feature or characteristic that affects the amount of energy required to dispense the product. Additional factors may include dispenser to dispenser variation, product to product variation, bottle to bottle variation, change of product type associated with a dispenser, any transient voltage drop due to a high density of dispenses, battery voltage change with temperature, etc.

Referring again to FIG. 4, the dispenser data received from each dispenser includes battery voltage information that is correlated to the actual battery voltage of the dispenser. In the example described herein, the voltage information is measured by a voltage sensing circuit, such as an ADC (analog-to-digital) voltage sensing circuit that measures the analog voltage of battery/power supply and converts the voltage to a digital value within a specified range. This digital value is thus correlated to the actual analog battery voltage. For example, for a 10-bit analog-to-digital converter, the detected analog voltage may be converted to a digital value in the range of 0-1023, where 0 is equivalent to 0.0 Volts and 1023 is equivalent to a maximum voltage supplied by the battery/batteries used in the relevant dispenser. It shall be understood that this resolution is an example only, and that the resolution of the ADC may be chosen such that the transition to a low-battery condition may be accurately detected.

At some point after the dispenser data is communicated from the dispenser, a computing device (such as any of computing device(s) 30, 52, or 54, or other appropriate computing device(s)) receives the battery voltage information (202). For example, the computing device may receive a digital indication correlated to the analog battery voltage. The computing device may receive the battery voltage information after completion of each dispense event, at periodic intervals (e.g., once per hour, one per day, etc.), upon request of the computing device, or at any other time.

As described above, the low battery threshold may vary depending upon a variety of factors associated with the dispense, such as they type of dispenser, the type or form of product dispensed, etc. The computing device determines one or more factors associated with the dispense, such as the dispenser type (204), the product type/name (206) or other factor(s), that may affect the low battery threshold. The relevant factors (dispenser type, product type, product name, etc.) may be determined in several ways. For example, the dispenser type and/or product type/name/form may be stored at or with respect to each dispenser, and may be included in the dispenser data communicated by the dispenser for each dispense event, along with the dispense event information and the battery voltage information. The dispenser type and/or product name/type may also be determined by looking up the dispenser id in a lookup table or other data structure (e.g., such a data structure may be included in hospital data 61A-61N in data store 60) and extracting the relevant dispenser type and/or product name/type/form from the corresponding entries in the data store.

The computing device identifies the appropriate low battery threshold based on the one or more factors (208). For example, one or more low battery threshold(s) may be empirically determined and stored in the data store 60 as low battery threshold data 64A-64N (see FIG. 3).

The computing device analyzes the received voltage information to determine whether it satisfies the low battery threshold (210). If the received voltage information does not satisfy the low battery threshold, the battery or batteries in the dispenser are determined to have sufficient voltage remaining to power additional dispenser activations. The results of the analysis may be stored in a data base (e.g., data store 60 of FIG. 3).

If the received voltage information satisfies the low battery threshold (210), the computing device detects a low battery condition (212). The computing device generates a low battery message or alert (214). Generating the low battery message or alert may include storing information related to the low battery condition and/or transmitting the low battery alert or condition to one or more of a user computing device(s) or hospital computing device(s). Alternatively, or in addition, generating the low battery message or alert may include activating one or more of audible and/or visual indicators on the associated dispenser to indicate a low battery condition.

Figure 5A:
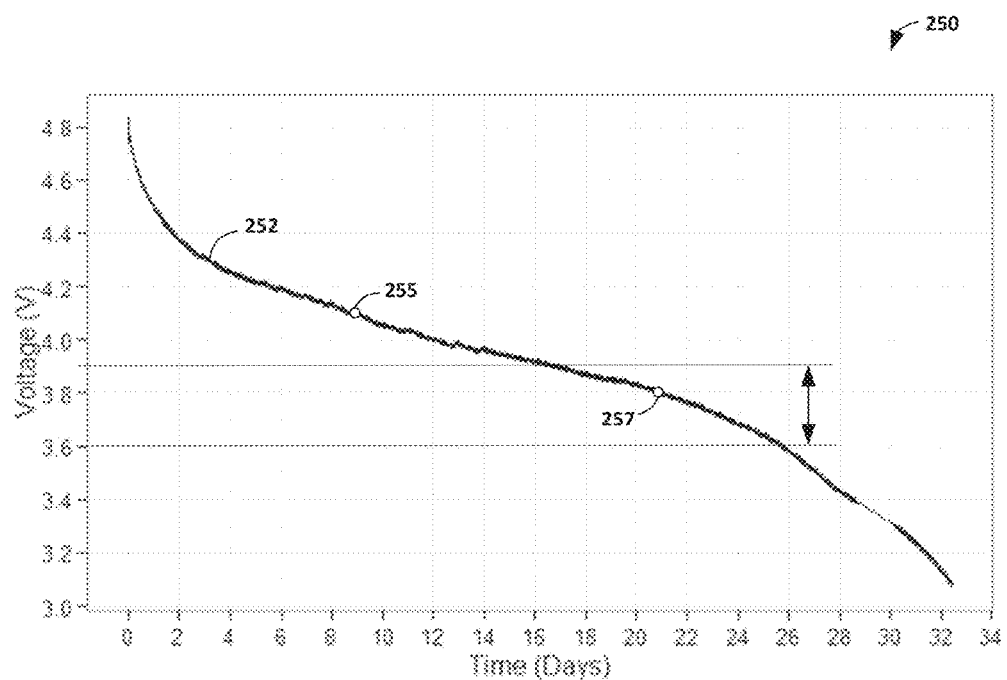
FIG. 5A is a graph illustrating an example discharge profile for a hand hygiene product dispenser powered with 3 D batteries under a constant load of 200Ω.

One or more low battery thresholds 64A-64N (see FIG. 3) may be empirically determined based on test measurements gathered from a plurality of dispensers during dispensation of different types and/or forms of hand hygiene products. FIG. 5A is a graph 250 illustrating an example discharge profile 252 for a dispenser powered with 3 Duracell® D batteries under a constant load of 200Ω. This is equivalent to about 5 dispenses a minute in this example. In the example of FIG. 5A, the voltage measurements were obtained in the intervals between dispense events as opposed to during a dispense event. It should be noted that the absolute scale of the axis is not as important as the shape of the curve. These values will be used in subsequent computations.

In this example, when voltage is measured as described, the tests indicate that the low voltage threshold can range from 3.9V to 3.6V, depending upon the type of dispenser and the type of product dispensed. When deciding on a low battery threshold, there is a balance between ensuring that batteries are replaced before a low battery condition occurs, thus reducing the possibility that a dispenser is left with insufficient battery life to power a dispense event, and reducing the frequency of battery replacement so as to get as many dispenses out of each battery as possible, thus saving time and cost associated with replacing batteries before they are fully discharged (discharged in the sense that they do not have sufficient battery voltage remaining to power another dispense).

In some examples, a global low battery threshold may be used that covers all possible combinations of dispensers and dispensed product types. To ensure that a dispenser has sufficient battery under all possible conditions, such a global low battery threshold may be set at the highest low battery threshold level empirically determined for all tested combinations. This is to avoid the case where a dispenser has insufficient battery voltage to power a dispense prior to detection of a low battery condition and generation of a low battery condition warning. In the example of FIG. 5A, an empirically determined global low battery threshold of 3.9 Volts is shown for the combination of dispensers and products tested. It shall be understood that the numerical values of FIG. 5A are set forth for example purposes only, and that the numerical values for both the x and y-axes, and also the global low battery threshold, may vary depending upon the dispenser type and/or dispensed product types or other factors.

In some examples, dispensers or products with a relatively lower low battery threshold (that is, dispensers or products that do not require as much remaining battery voltage to power a dispense), a low battery condition may be signaled too early if a global low battery threshold is used. In other words, in such a case, a relatively higher global low battery threshold may cause a low battery condition to be noted even though the batteries still contain sufficient voltage to power dispense events for lower energy requiring products (such as relatively lower viscosity liquids, which may generally require relatively less energy to power a dispense than relatively higher viscosity liquids, gels, or foams, for example). In the example of FIG. 5A, a relatively lower low battery threshold of 3.6 Volts was empirically determined to be an appropriate low battery threshold for these types of dispensers tested.

Figure 6:
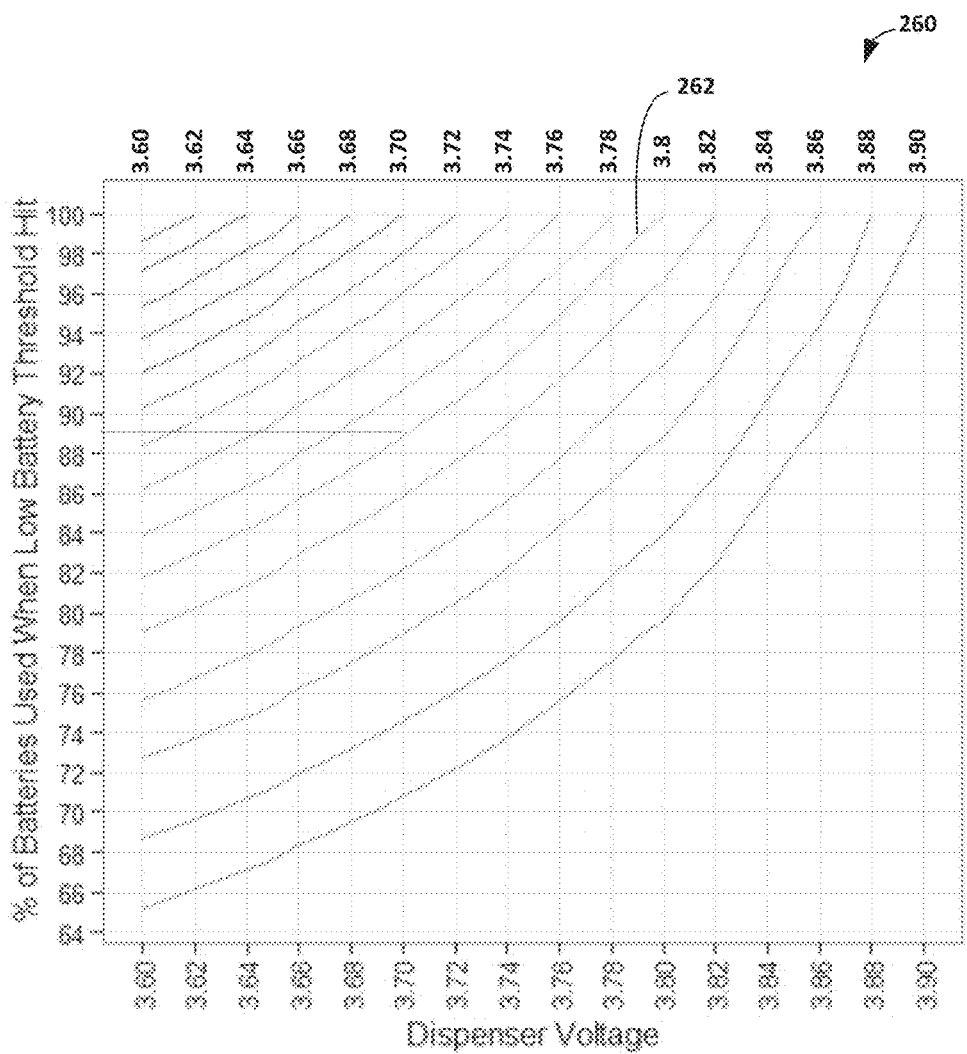
FIG. 6 is a graph illustrating example battery usage over a matrix of use conditions in a hand hygiene product dispenser.

FIG. 6 is a graph 260 illustrating example battery usage over a matrix of use conditions for an example hand hygiene product dispenser. The x-axis shows various example low battery threshold voltages and the y-axis shows the percentage of battery used at each low battery threshold voltage. The graph of FIG. 6 may be used to run multiple low battery voltage threshold scenarios. This may be illustrated by the following example:

(1) Assume a product that would ideally indicate a low battery condition at 3.7V.

(2) However, assume a low battery threshold will be set at 3.8V in this example.

The percent battery utilization at a low battery threshold at 3.8V may be determined as follows:

(1) Identify the curve associated with a low battery threshold of 3.8V. This curve may be identified as the one that intersects x=3.8 at the value y=100 as indicated by reference numeral 262.

(2) Determine where this curve intersects x=3.7V.

(3) The y-axis value associated with this point corresponds to the percent battery utilization at the selected low battery threshold. For purposes of this example, full utilization is defined as the battery being used to 3.7V. In this example where the low battery threshold is 3.8V, the percent utilization when a low battery condition will be indicated is approximately 89%.

The y scale (battery utilization in percent) may be calculated as follows:

$$100 \times \frac{T_{implemented}}{T_{ideal}}$$

Where $T_{implemented}$=the time to reach the implemented low battery threshold, and $T_{ideal}$=the time to reach the ideal low battery threshold.

In some examples, the dispenser low battery threshold takes into account noise in the voltage reading. For example, the amount of noise present in the dispenser voltage reading will affect how closely the voltage reading correlates with the actual battery voltage. This noise may thus further influence what the low battery threshold should be.

For example, let $T_v$ be the low battery voltage threshold level at which a low battery notification should occur. To satisfy this condition, low battery notifications may be triggered at $T_v + v_{noise}$.

Without the addition of the $v_{noise}$ term, a dispenser could be running at a lower voltage than $T_v$ without triggering a low battery notification. It follows that the earliest a dispenser would cross the $T_v + v_{noise}$ threshold occurs when voltage is read with a noise level of $-v_{noise}$. This would be a worst case scenario. The best case for crossing the $T_v + v_{noise}$ threshold occurs when the measured voltage with a noise level of $+v_{noise}$. In this case the expected battery usage would be 100%.

Low battery thresholds, discharge profiles such as that shown in FIG. 5, and Usage Graphs such as that shown in FIG. 6 may be empirically determined for one or more dispenser types and/or one or more dispensed product types, forms or names. For example, low battery threshold data 64A-64B (FIG. 3) may store one or more low battery thresholds, each corresponding to a dispenser type and/or dispensed product type, form or name. The low battery threshold may be expressed as an absolute voltage, a percentage of voltage discharged or remaining, or other method of measuring a battery voltage. As another example, low battery threshold data 64A-64B may store one or more discharge profiles, such as that shown in FIG. 5, each corresponding to a dispenser type and/or dispensed product type, form or name. As another example, low battery threshold data 64A-64B may store one or more usage graphs, such as that shown in FIG. 6, each corresponding to a dispenser type and/or dispensed product type, form or name.

Table 1 shows example low battery thresholds for different combinations of hypothetical dispenser types (in rows) and hypothetical dispensed product names (columns). This Table may stored as, for example, low battery threshold data 64A-64N as shown in FIG. 3. The entries in each cell correspond to the low battery threshold empirically determined for that combination of dispenser type and dispensed product name. For example, for a Type 1 Touch Free Dispenser dispensing a product having a product name, "Waterless Hand Sanitizer," the example low battery threshold is 3.7 Volts. As another example, for a Type-3 Touch Free Dispenser dispensing a product having the product name, "Enriched Foaming Hand Soap," the example low battery threshold is 3.9 Volts.

Using the example Low Battery Thresholds of Table 1, to detect whether or not a low battery condition is present for a Touch Free Type-3 dispenser that is dispensing Foaming Hand Sanitizer, the sensed battery voltage as detected by the dispenser would be compared to the corresponding low battery threshold voltage of 3.9 Volts. If the sensed battery voltage was less than (or equal to) 3.9 Volts, the system would generate a low battery condition alert or message.

TABLE 1

| | Low Battery Thresholds (Volts) | | | | | | |
|---|---|---|---|---|---|---|---|
| Dispenser Type | Waterless Hand Sanitizer | Express Hand Sanitizer | Foaming Hand Sanitizer | Moisturizing Hand Soap | Sensitive Skin Hand Soap | Enriched Foaming Hand Soap | Revitalizing Skin Lotion |
| Touch Free Type-1 | 3.7 | 3.6 | 3.9 | 3.6 | 3.6 | 3.9 | 3.7 |
| Touch Free Type-2 | 3.8 | 3.6 | 3.9 | 3.7 | 3.7 | 3.9 | 3.7 |
| Touch Free Type-3 | 3.8 | 3.6 | 3.9 | 3.7 | 3.7 | 3.9 | 3.7 |

Table 2 shows example low battery thresholds for different combinations of dispenser types (in rows) and dispensed product types/forms (columns). This Table may stored as, for example, part of low battery threshold data 64A-64N as shown in FIG. 3. The entries in each cell correspond to the low battery threshold empirically determined for that combination of dispenser type and dispensed product type/form. For example, for a Type 1 Touch Free Dispenser dispensing a product of type Sanitizer-Foam, the example low battery threshold is 3.9 Volts. As another example, for a Type-2 Touch Free Dispenser dispensing of type Lotion, the example low battery threshold is 3.7 Volts.

Using the example Low Battery Thresholds of Table 2, the sensed battery voltage received from a Touch Free Type-3 dispenser that is dispensing a gel hand soap would be compared to the corresponding low battery threshold voltage of 3.7 Volts. If the sensed battery voltage was less than (or equal to) 3.7 Volts, the system would generate a low battery condition alert or message.

TABLE 2

| | Low Battery Thresholds (Volts) | | | | | | |
|---|---|---|---|---|---|---|---|
| Dispenser Type | Sanitizer-Gel | Sanitizer-Liquid | Sanitizer-Foam | Hand Soap-Gel | Hand Soap-Liquid | Hand Soap-Foam | Lotion |
| Touch Free Type-1 | 3.7 | 3.6 | 3.9 | 3.6 | 3.6 | 3.9 | 3.7 |
| Touch Free Type-2 | 3.8 | 3.6 | 3.9 | 3.7 | 3.7 | 3.9 | 3.7 |

TABLE 2-continued

| | Low Battery Thresholds (Volts) | | | | | | |
|---|---|---|---|---|---|---|---|
| Dispenser Type | Sanitizer-Gel | Sanitizer-Liquid | Sanitizer-Foam | Hand Soap-Gel | Hand Soap-Liquid | Hand Soap-Foam | Lotion |
| Touch Free Type-3 | 3.8 | 3.6 | 3.9 | 3.7 | 3.7 | 3.9 | 3.7 |

Table 3 shows example low battery thresholds for different dispenser types. In this example, low battery thresholds are established for each dispenser type, regardless of what product is being dispensed. If a dispenser type is able to dispense both foams and gels, for example, the low battery threshold for that dispenser may need to be set at a relatively higher threshold voltage corresponding to the foam product (as compared to the possibly relatively lower threshold voltage corresponding to the gel product) to ensure that a low battery condition is indicated before the battery voltage remaining falls too low to power any further foam product dispenses. Depending upon the dispenser and the products dispensed, this assignment of low battery thresholds may result in a somewhat premature detection of a low battery condition in the case where the same dispenser is dispensing a gel.

This Table may stored as, for example, part of low battery threshold data 64A-64N as shown in FIG. 3. Each row corresponds to a dispenser type and the associated low battery threshold. For example, for a Dispenser Type-1, the example low battery threshold is 3.7 Volts. For a Dispenser Type-3, the example low battery threshold is also 3.7 Volts, for a Dispenser Type-2 the example low battery threshold is also 3.6 Volts, and for a Dispenser Type-7 the example low battery threshold is 3.9 Volts. If the sensed battery voltage is less than the Low Battery Threshold indicated in Table 3, the system would generate a low battery condition alert or message.

TABLE 3

Discharge Profiles - Dispenser/Product Types

| Dispenser Type | Low Battery Threshold (Volts) |
|---|---|
| Dispenser Type-1 | 3.7 |
| Dispenser Type-2 | 3.6 |
| Dispenser Type-3 | 3.7 |
| Dispenser Type-4 | 3.6 |
| Dispenser Type-5 | 3.8 |
| Dispenser Type-6 | 3.7 |
| Dispenser Type-7 | 3.9 |

The battery condition detection techniques described herein may also be used in the detection of other types of dispenser information. For example, if the system does not have the dispenser type information and/or the dispensed product type/name/form information stored for one or more dispensers in a healthcare facility, analysis of the voltage profile received for those dispensers may be permit identification of the dispenser type and/or the dispensed product type. For example, certain "small" dispensers may be powered using 3 "C" batteries, while certain "large" dispensers may be powered using 3 "D" batteries. Both C and D batteries are listed at 1.5 Volts; however, D batteries contain more energy than C batteries, so the voltage drop per dispense in a hand hygiene product dispenser may be less. Thus, it may be possible to determine the dispenser type (e.g., large or small) based on how the received voltage decreases over time. This information may also allow the system to correlate voltage readings with specific sets of batteries. Reports of the voltage usage over time would give visibility into how the field uses the dispensers.

Figure 5B:
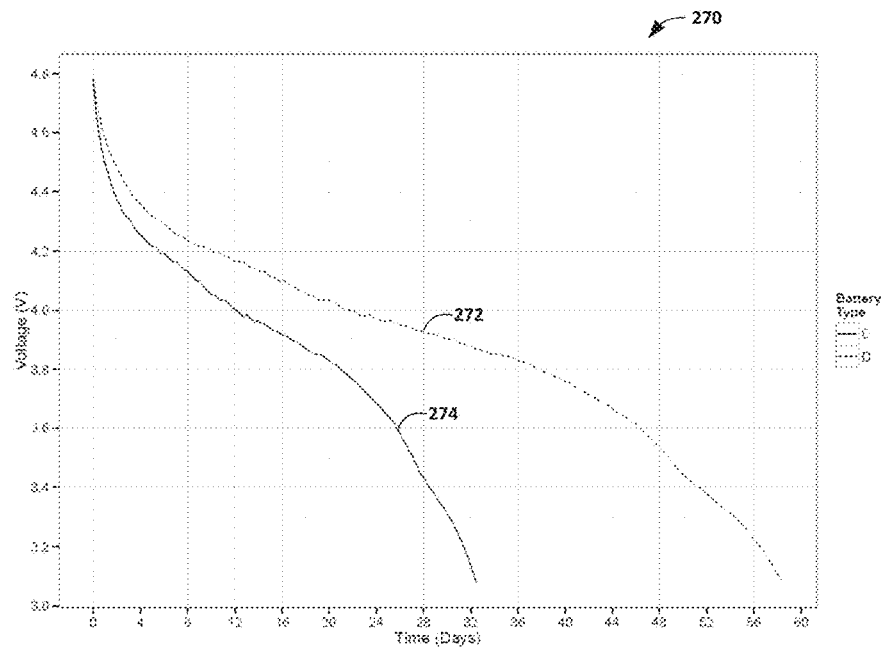
FIG. 5B is a graph illustrating example discharge profiles for a first type of hand hygiene dispenser powered by 3 D batteries and a second type of hand hygiene dispenser powered by 3 C batteries.

FIG. 5B is a graph 270 of Dispenser Voltage versus Time for an example discharge profile 272 for a first type of hand hygiene dispenser powered by 3 D batteries and an example discharge profile 274 for a second type of hand hygiene dispenser powered by 3 C batteries. The voltage information from the discharge profiles 272, 274 may be used to identify the type of hand hygiene product dispenser. For example, the voltage information from a dispenser of an unknown type received over a period of time (or over a predetermined number of dispense events) may be compared to the empirically determined voltage information for one or more dispenser types to determine the dispenser type based on the voltage information received from the dispenser. For example, in FIG. 5B, the derivative of the voltage curve 274 (e.g., the rate at which the voltage decreases over time) empirically determined for dispensers powered by C batteries is relatively greater than the derivative of the voltage curve 272 empirically determined for dispensers powered by D batteries. In one example, discharge rates (e.g., the derivatives) of the voltage information from a dispenser received over time may be averaged and compared to empirically determined voltage discharge rate information for one or more dispenser types. The dispenser may be identified as the type of dispenser associated with the empirically determined voltage discharge information that most closely matches that measured voltage discharge rate information received from the dispenser. For example, if the voltage discharge rate information received from a dispenser of an unknown type more closely matches curve 274 rather than curve 272, the dispenser may be identified as a dispenser powered by battery type C.

Figure 5C:
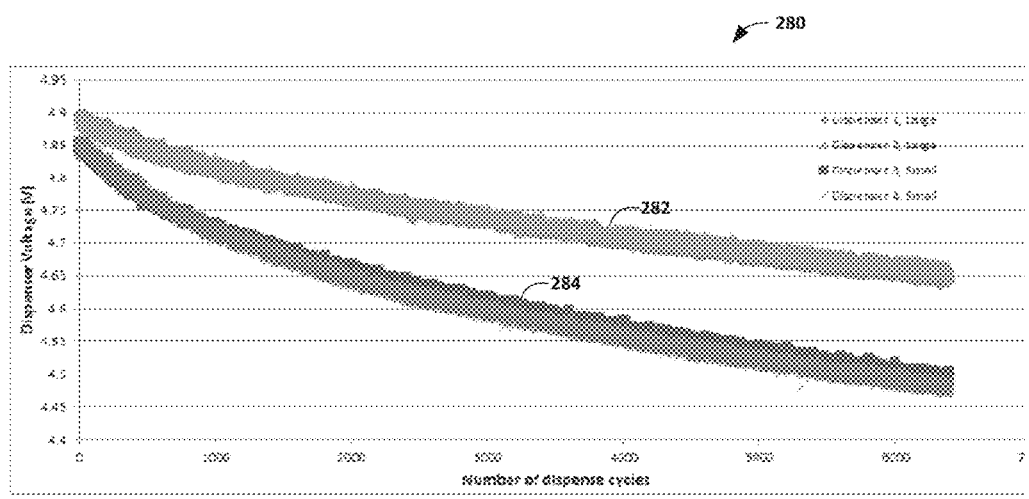
FIG. 5C is a graph illustrating example discharge profiles for a "Large" type hand hygiene dispenser and a "Small" type hand hygiene dispenser.

FIG. 5C is a graph 280 of Dispenser Voltage versus Number of Dispenses for an example discharge profile 282 for a first ("Large") type of hand hygiene dispenser and an example discharge profile 284 for a second ("Small") type of hand hygiene dispenser. As described above with respect to FIG. 5B, the voltage information from the discharge profiles 282, 284 may be used to identify the type of hand hygiene product dispenser. For example, the voltage information from a dispenser of an unknown type received over a predetermined number of dispense events (or over a predetermined period of time) may be compared to the empirically determined voltage information for one or more dispenser types to determine the dispenser type based on the voltage information received from the dispenser. For example, in FIG. 5C, the derivative of the voltage curve 284 (e.g., the rate at which the voltage decreases over time) empirically determined for "Small" type dispensers is relatively greater than the derivative of the voltage curve 282 empirically determined for "Large" type dispensers. In one example, discharge rates (e.g., the derivatives) of the voltage information from a dispenser received over time may be averaged and compared to empirically determined voltage discharge rate information for one or more dispenser types. The dispenser may be identified as the type of dispenser associated with the empirically determined voltage discharge information that most closely matches that measured voltage discharge rate information received from the dispenser. For example, if the voltage discharge rate information received from a dispenser of an unknown type more closely matches curve 284 rather than curve 282, the dispenser may be identified as a "Small" type dispenser.

Referring again to FIG. 5A, analysis of a discharge profile for a hand hygiene product dispenser may further permit the system to determine the number of dispenses remaining before the battery will encounter a low battery condition. For example, for a known discharge profile, such as discharge profile 252, the voltage at any particular location on the discharge profile may be empirically determined, based on data received from one or more dispensers of the same type, to have a corresponding number of dispenses remaining before the battery voltage reached the defined low battery condition. In FIG. 5, for example, if the low battery threshold is 3.9 Volts, the Voltage of 4.1 Volts sensed on Day 8 may be empirically determined to correspond to a first number of dispenses remaining. If the low battery threshold is 3.6 Volts, the Voltage of 4.1 Volts sensed on Day 8 may be empirically determined to correspond to a second number of dispenses remaining. The second number of dispenses remaining in this example would relatively greater than the first number of dispenses remaining. Similarly, the Voltage at any point along the discharge profile 252 may be empirically determined to correspond to a corresponding number of dispenses remaining. The number of dispenses remaining data may be saved along with the dispense event record, and included in one or more reports. The number of dispenses remaining may also be analyzed and compared to previously obtained data for that dispenser and/or for other dispensers to provide insight into dispenser usage and/or detect or diagnose dispenser problems.

In addition, the number of dispenses remaining may be individually determined for a dispenser by comparing historical voltage information for the dispenser with the current voltage information for the dispenser. For example, for a particular dispenser, the historical number of dispenses that occurred over a voltage drop could be used to predict the number of dispenses remaining for the same voltage drop for that dispenser. This could be used to compensate for the power consumption of a particular dispenser and/or variations in power consumption between dispensers of the same type.

Figure 7:
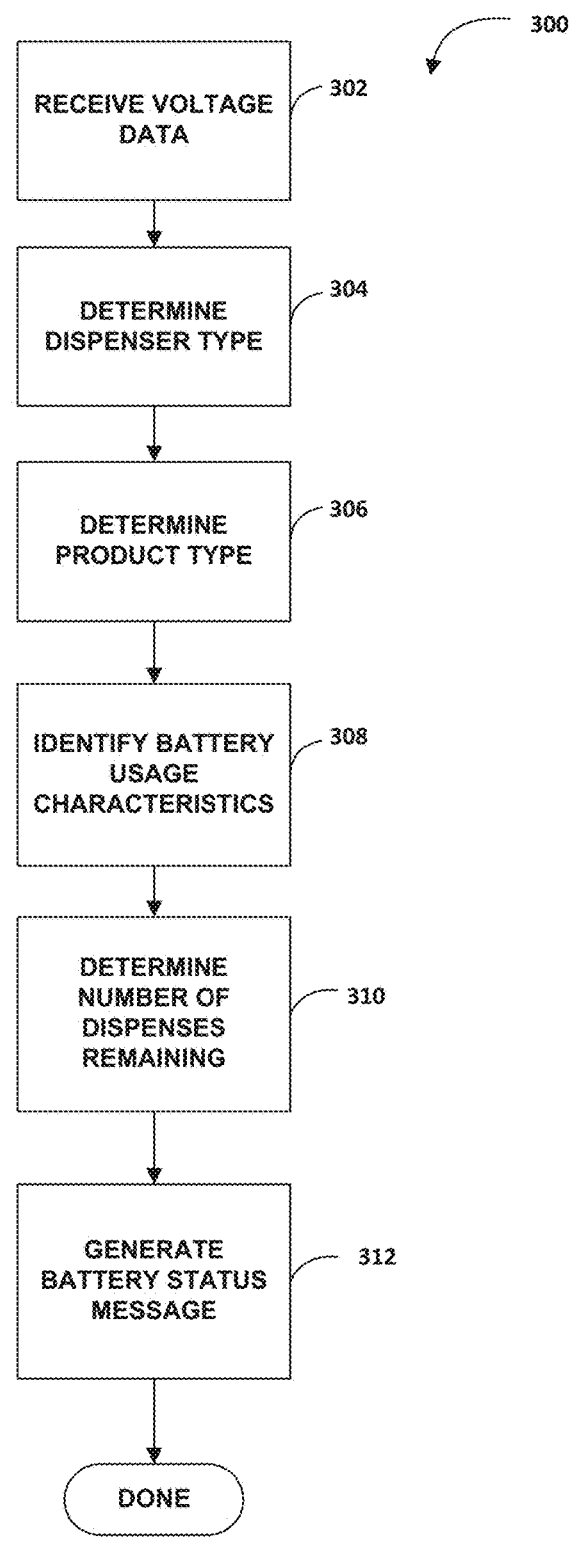
FIG. 7 is a flowchart illustrating an example process by which a computing device may determine a number of dispenses remaining based on battery voltage information received from a hand hygiene product dispenser.

FIG. 7 is a flowchart illustrating an example process (300) by which a computing device may determine a number of dispenses remaining based on battery voltage information received from a hand hygiene product dispenser. A computing device (such as hospital computing device(s) 54, server computing device(s) 52, or other appropriate computing device(s)) receives battery voltage information that is correlated to the actual battery voltage of a dispenser (302). For example, the computing device may receive a digital indication correlated to the analog battery voltage. The computing device may receive the battery voltage information after each dispenser activation, at periodic intervals (e.g., once per hour, one per day, etc.), upon request of the computing device, or at any other time.

The computing device determines one or more factors associated with the dispense, such as the dispenser type (304), the product type (306) or other factor(s), that may affect the low battery threshold. The relevant factors (dispenser type, product type, product name, etc.) may be determined in several ways. For example, the dispenser type and/or product type/name/form may be stored in the dispenser data on each dispenser, and may be included in the dispenser data communicated by the dispenser for each dispense event, along with the dispense event information and the battery voltage information. The dispenser type and/or product type may also be determined by looking up the dispenser id in a lookup table or other data store (e.g., hospital data 61A-61N in data store 60) and extracting the relevant dispenser type and/or product name/type/form from the corresponding entries in the data store.

The computing device may analyze the received voltage information over time to identify the battery usage characteristics (308). For example, the received voltage information may be analyzed along with an empirically determined battery usage graph associated with the dispenser and/or the dispensed product (such as that shown in FIG. 5 or 6) to determine the percentage of battery remaining and/or the absolute voltage as compared to the low voltage threshold. The percentage of battery remaining and/or the absolute voltage may be further correlated to a number of dispenses remaining. In another example, the number of dispenses remaining correlated to given battery voltages or percentage of battery remaining may be empirically determined and stored in, for example, low battery threshold data 64A-64N of data store 60. In either case, the computing device may determine the number of dispenses remaining based on the received current battery voltage information (310). Similarly, in other examples, the computing device may estimate the amount of time remaining before a low battery condition will occur, based on the received battery voltage information and based on a number of dispenser activations estimated to occur within a defined period of time. The number of dispenser activations may be estimated based on past usage of the dispenser, on past usage of multiple dispensers, on an average of dispenser usage over time, etc.

The computing device may further generate a battery status message indicating one or more of the absolute battery voltage, the number of dispenses remaining, the estimated amount of time before a low battery condition may be detected, etc. (312).

Figure 11:
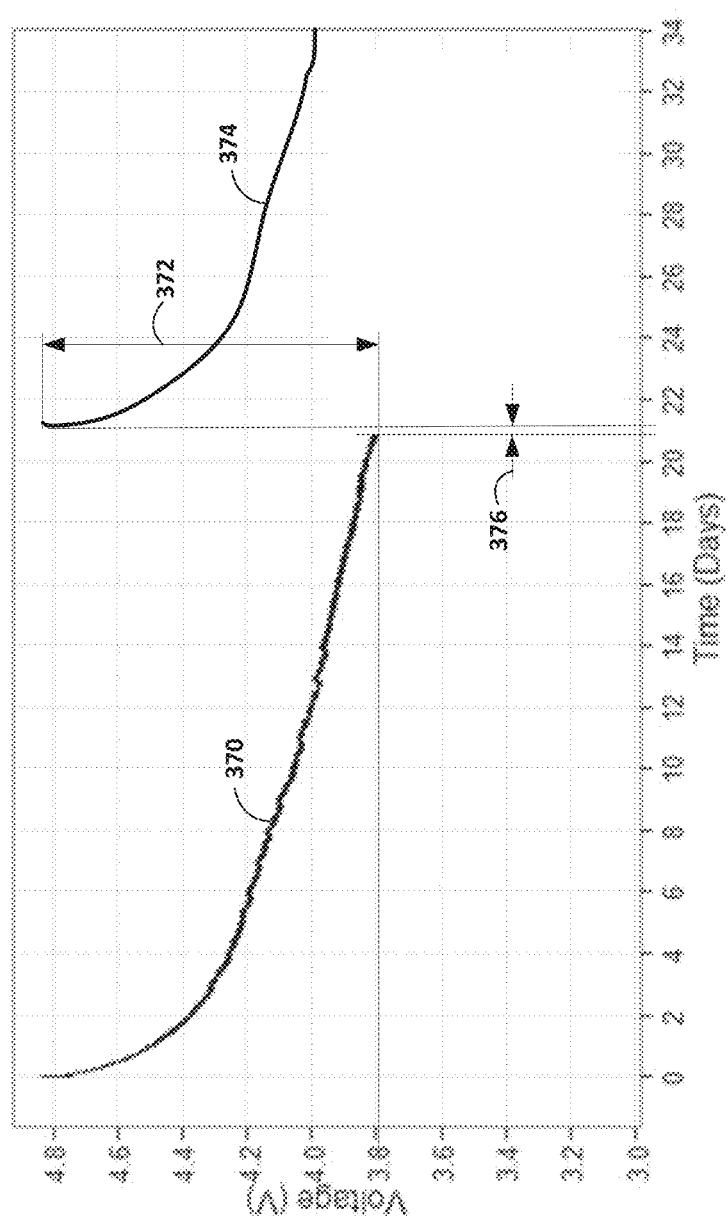
FIG. 11 is a graph illustrating an example discharge profile for a hand hygiene product dispenser in which a battery was replaced.

As another example of the voltage condition detection techniques of the present disclosure, analysis of the voltage profile received for a dispenser may allow a system to identify when a dispenser's batteries have been changed out (removed and/or replaced). FIG. 11 is a graph illustrating an example discharge profile 370 for a hand hygiene product dispenser in which a battery was replaced. In the example of FIG. 11, the voltage measurements were obtained in the intervals between dispense events as opposed to during a dispense event. It should be noted that the absolute scale of the axis is not necessarily to scale. In this example, analysis of the discharge profile 370 indicates that the voltage gradually drops off from a peak of about 4.8 Volts on Day 0 to about 3.8 Volts on Day 20. At some point in time during Day 21, no voltage information is received for a period of time indicated by reference numeral 376. This is indicative of removal of the battery or batteries, as if the dispenser has no power it is not operational and will not transmit any voltage information for the period of time during which the batteries are removed. Curve 374 indicates an abrupt voltage increase 372 (as compared to the previous voltage reading of about 3.8 Volts) which signifies the end of the period of time 376. The subsequent data indicates that the voltage gradually drops off again from Day 21 to Day 34, as indicated by reference numeral 374. The abrupt voltage increase 372 may be due to a battery replacement event, which caused the sensed dispenser battery voltage detected by, for example, voltage sensor 28 (see FIG. 2) to detect the relatively higher voltage of a new battery (4.8 Volts in this example) installed into the dispenser on Day 21 as compared to the relatively more depleted battery voltage (3.8 Volts in this example) of the battery that was in use from day 0 to Day 20.

In some examples, the system may be configured to detect a battery replacement event if the voltage information received from the dispenser includes a voltage increase having a predefined change in amplitude. The predefined change in amplitude may depend in part upon the dispenser type, as different dispenser types may be powered by different batteries having different voltage ratings. The predefined change in amplitude may be measured from zero Volts (no battery or battery removed) and a subsequent peak Voltage (battery replaced) or it may be measured from the previously recorded depleted voltage (e.g., 3.8 Volts in FIG. 11 or the minimum voltage before the period of time in which no voltage information is received) and a subsequent peak voltage (e.g. 4.8 Volts or battery replaced). In some examples, the system may further determine the period of time (e.g., as indicated by reference numeral 376) between the previously recorded minimum depleted voltage and the subsequent peak Voltage and compare that to a predefined period of time as an additional factor in the detection of a battery replacement event.

Figure 8:
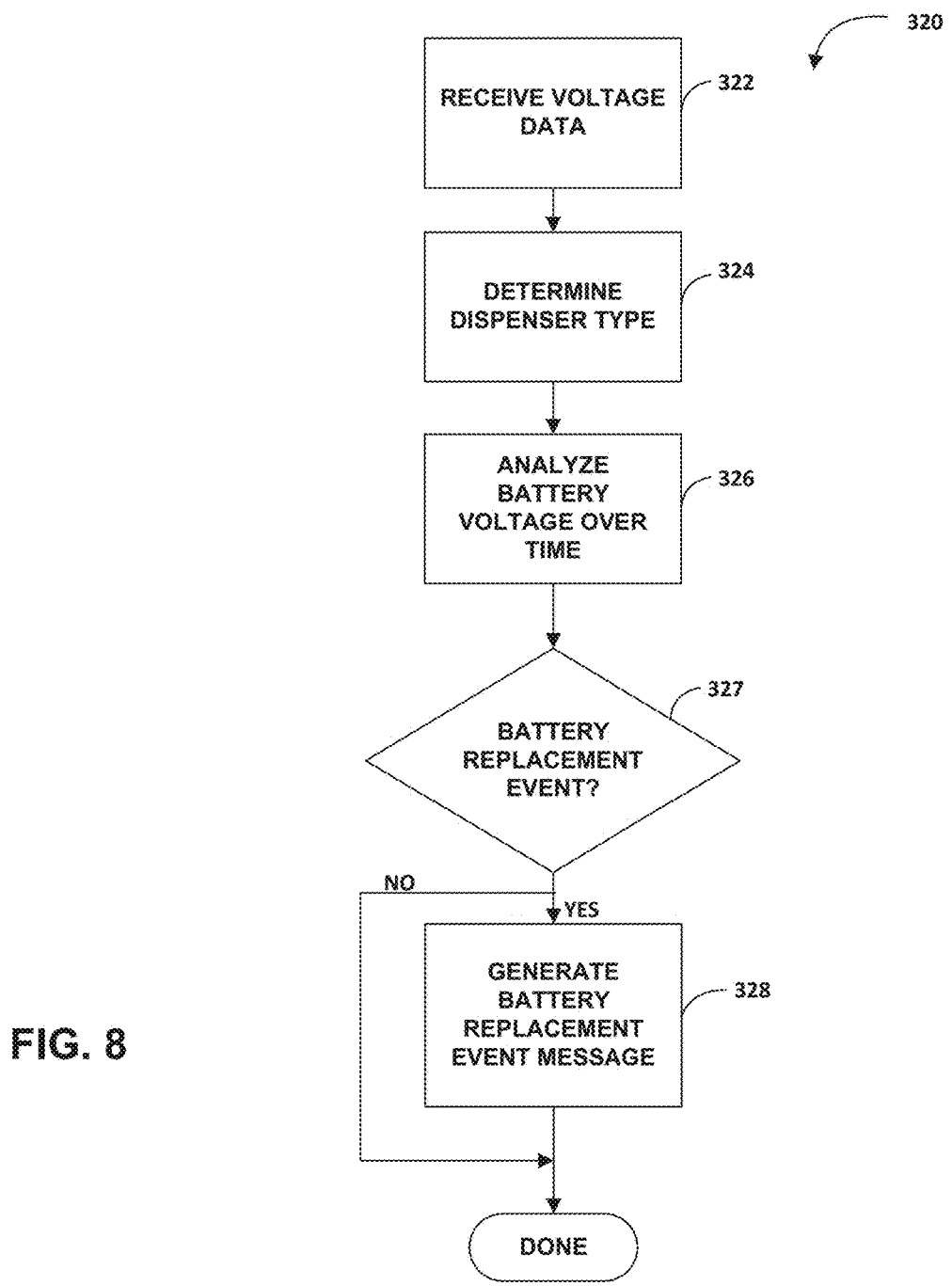
FIG. 8 is a flowchart illustrating an example process by which a computing device may identify a battery replacement event based on battery voltage information received from a hand hygiene product dispenser.

FIG. 8 is a flowchart illustrating an example process (320) by which a computing device may identify a battery replacement event based on battery voltage information received from a hand hygiene product dispenser. A computing device (such as hospital computing device(s) 54, server computing device(s) 52, or other appropriate computing device(s)) receives battery voltage information that is correlated to the actual battery voltage of a dispenser (322). For example, the computing device may receive a digital indication correlated to the analog battery voltage. The computing device may receive the battery voltage information after each dispenser activation, at periodic intervals (e.g., once per hour, one per day, etc.), upon request of the computing device, or at any other time.

As discussed above, the computing device determines one or more factors associated with the dispense, such as the dispenser type (324) dispensed product information, or other factor(s), that may affect the low battery threshold. The computing device may analyze the received voltage information over time (326). For example, the received voltage information may be analyzed along with an empirically determined battery usage graph associated with the dispenser and/or the dispensed product (such as that shown in FIG. 5 or 6) to determine the percentage of battery remaining and/or the absolute voltage as compared to the low voltage threshold. If the analysis identifies a batter replacement event, the system generates a battery replacement event message, and may store the battery replacement event information along in a data store (328). A change in the received battery voltage may be used to identify a battery replacement event. For example, a sudden increase in the received battery voltage may, such as that shown in FIG. 11, may indicate that new batteries were installed in a dispenser. The computing device may generate a battery status message/report indicating that the batteries were replaced (328), along with, for example, a time and date stamp indicating the time of the replacement. This information may be used to confirm that batteries have been replaced, as well as to analyze the propriety of the replacement (such as whether the batteries were replaced at the proper time, replaced too early or too late). The computing device may further analyze the battery replacement information regarding multiple dispensers and their associated battery replacement history to present information concerning battery replacement over time in a hospital or other facility in which hand hygiene behaviors are to be monitored.

Figure 9:
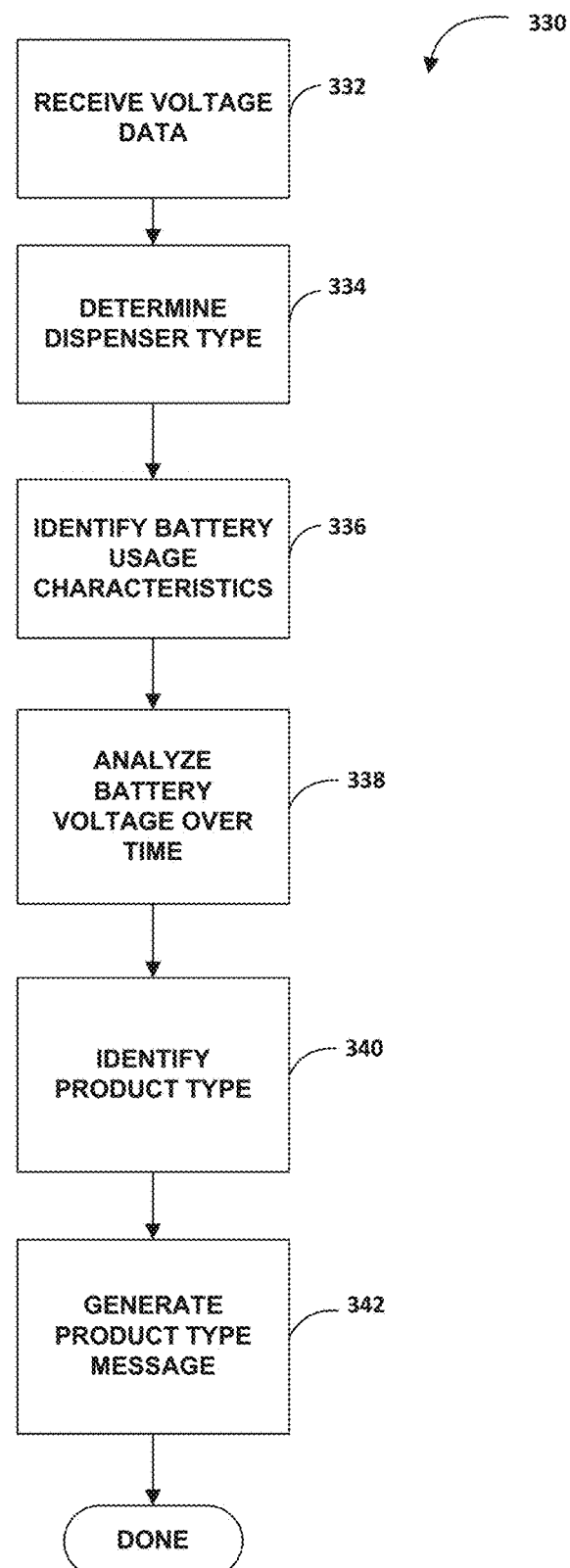
FIG. 9 is a flowchart illustrating an example process by which a computing device may identify a product type based on battery voltage data received from a hand hygiene product dispenser.

FIG. 9 is a flowchart illustrating an example process (330) by which a computing device may identify a product type based on battery voltage data received from a hand hygiene product dispenser. Such a process may be useful when the product type is not known, or if the battery usage data does not conform to the empirically determined battery usage data for the stored product type, which may indicate that a different or unauthorized product type has been loaded into the dispenser than indicated by the information stored in the system.

A computing device (such as hospital computing device(s) 52, server computing device(s) 30, or other appropriate computing device(s)) receives battery voltage information that is correlated to the actual battery voltage of a dispenser (332). For example, the computing device may receive a digital indication correlated to the analog battery voltage. The computing device may receive the battery voltage information after each dispenser activation, at periodic intervals (e.g., once per hour, one per day, etc.), upon request of the computing device, or at any other time.

As discussed above, the computing device determines one or more factors associated with the dispense, such as the dispenser type (334) or other factor(s). The computing device may identify the battery usage characteristics based on the one or more factors (336). The computing device may analyze the voltage information received from the dispenser over time (338). For example, the voltage information received from the dispenser may be analyzed along with the battery usage characteristics associated with the dispenser type and one or more dispensed products (such as that shown in FIG. 5 or 6). The received voltage information over time may be compared to the empirically determined battery usage graphs to identify one of the empirically determined battery usage graphs that most closely matches the received voltage information. The product or subset of products associated with the identified battery usage graph may be identified as the product type (340). The computing device may generate a product type message (342). This information may be used to confirm proper hand hygiene product placement, or identify instances where a dispenser may have been loaded with a different or unauthorized hand hygiene product.

For example, the computing device may further compare the identified dispensed product type corresponding to the identified discharge profile with an authorized product type to determine whether the dispensed product type is an authorized product type (340). The system further configured to generate an unauthorized product type message if the dispensed product type is not an authorized product type (342).

Figure 10:
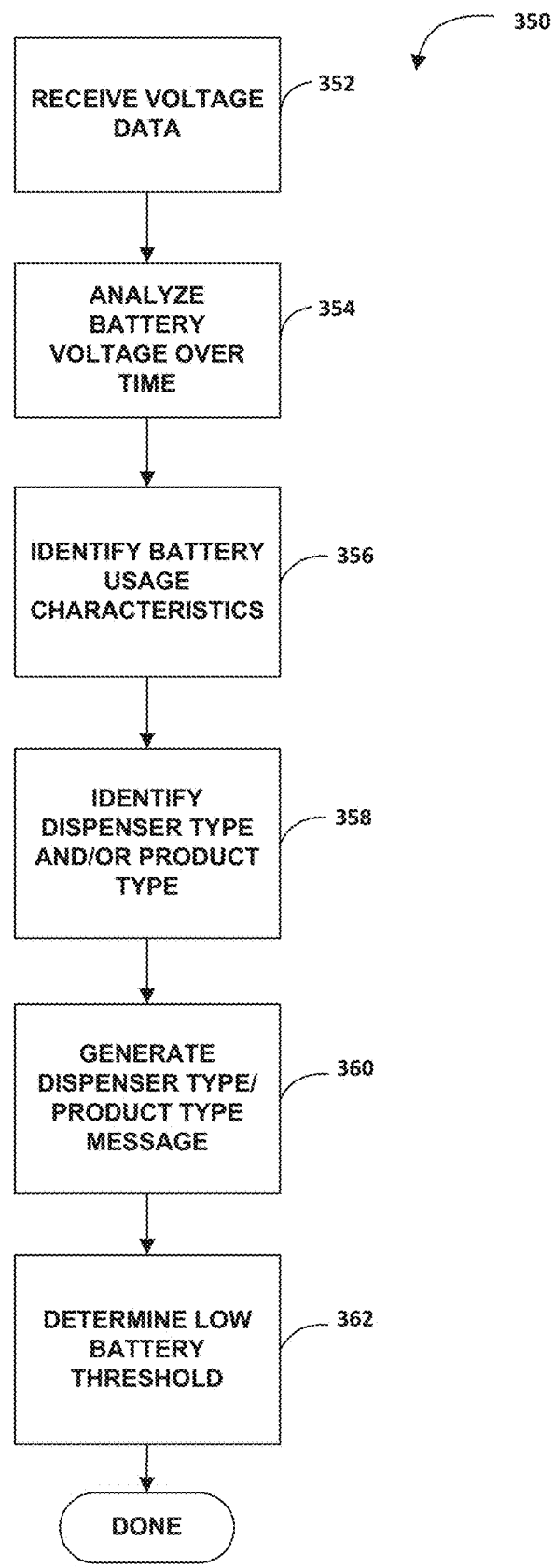
FIG. 10 is a flowchart illustrating an example process by which a computing device may identify a dispenser type and/or a product type based on battery voltage data received from a hand hygiene product dispenser.

FIG. 10 is a flowchart illustrating an example process (350) by which a computing device may identify a dispenser type and/or a product type based on battery voltage data received from a hand hygiene product dispenser. Such a process may be useful when the dispenser type is not known and/or the product type is not known.

A computing device (such as hospital computing device(s) 52, server computing device(s) 30, or other appropriate computing device(s)) receives battery voltage information that is correlated to the actual battery voltage of a dispenser (352). For example, the computing device may receive a digital indication correlated to the analog battery voltage. The computing device may receive the battery voltage information after each dispenser activation, at periodic intervals (e.g., once per hour, one per day, etc.), upon request of the computing device, or at any other time.

The computing device may analyze the received voltage information over time (354). For example, the received voltage information may be analyzed along with empirically determined battery usage graphs or discharge profile associated with one or more dispensers and one or more dispensed products (such as that shown in FIG. 5 or 6). The received voltage information over time may be compared to the empirically determined battery usage graphs to identify one of the empirically determined battery usage graphs that most closely matches the received voltage information (356). As described herein, each empirically determined battery usage graph or discharge profile is associated with a particular dispenser type and/or product or subset of products. Once the graph matching the received voltage information over time is determined, the computing device may identify the dispenser type and/or the product type (358) and may also generate a dispenser type and/or a product type message (360). The computing device may further determine the low battery threshold based on the battery usage graph, the discharge profile, the dispenser type and/or the dispense product type (362). This low battery threshold may be subsequently used to identify potential low battery conditions and generate low battery condition alerts for the dispenser.

The techniques described herein may be implemented in hardware, software, firmware or any combination thereof. If implemented in software, the techniques may be realized at least in part by a non-transitory computer-readable medium comprising instructions that, when executed by computer of a hand hygiene compliance system cause the computer to perform one or more of the techniques of this disclosure. The computer-readable data storage medium may form part of a computer program product, which may include packaging materials. The computer-readable medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, a magnetic disk or a magnetic tape, an optical disk or magneto-optic disk, CD, CD-ROM, DVD, a holographic medium, or the like. The instructions may be implemented as one or more software modules, which may be executed by themselves or in combination with other software.

The computer-readable instructions may be executed in the computer of the system by one or more processors, general purpose microprocessors, ASICs, FPGAs or other equivalent integrated or discrete logic circuitry.

The instructions and the media are not necessarily associated with any particular computer or other apparatus, but may be carried out by various general-purpose or specialized machines. The instructions may be distributed among two or more media and may be executed by two or more machines. The machines may be coupled to one another directly, or may be coupled through a network, such as a local access network (LAN), or a global network such as the Internet. Accordingly, the term "processor," as used herein may refer to any structure suitable for implementation of the techniques described herein.

Various aspects of the hand hygiene compliance system may also be embodied as one or more devices that include logic circuitry to carry out the functions or methods as described herein. The logic circuitry may include a processor that may be programmable for a general purpose or may be dedicated, such as microcontroller, a microprocessor, a Digital Signal Processor (DSP), an Application Specific Integrated Circuit (ASIC), a field programmable gate array (FPGA), and the like.

One or more of the techniques described herein may be partially or wholly executed in software. For example, a non-transitory computer-readable medium may store or otherwise comprise computer-readable instructions, i.e., program code that can be executed by a processor to carry out one of more of the techniques described above.

The hand hygiene compliance system may also incorporate healthcare worker training and continuing education, such as teaching new or ongoing skills and changing paradigms and behaviors within hospitals. These may include, for example, hand hygiene training, compliance/procedural training, training oversight/monitoring/interventions, comprehensive training to impact outcomes, medical school and association curriculum, certification training, etc. This may include both upfront and periodic refresher training, training materials and a training process to help ensure that HCWs are following hand hygiene best practices.

It should again be noted that although in certain examples features and combinations of features are depicted as modules or units working together, in different examples, the modules or units do not need to be realized by separate hardware or software components. Further, although combinations of features are depicted in various examples, all the features depicted in a specific example do not necessarily need to be implemented together to produce a hand hygiene system according to the disclosure.

Various examples have been described. These and other examples are within the scope of the following claims.

The invention claimed is:

1. A system comprising:
    a plurality of dispensers each configured to dispense a hand hygiene product, each dispenser configured to detect a dispense event and transmit a corresponding dispense event signal including dispenser identification information associated with the dispenser, each of the plurality of dispensers having an associated dispenser type and an associated dispensed product type;
    each of the plurality of dispensers further including:
    one or more batteries configured to supply power to the dispenser; and
    a voltage sensor that senses voltage information correlated to a battery voltage provided by the one or more batteries;
    data storage media that stores low battery threshold data, the low battery threshold data including one or more low battery thresholds each corresponding to a dispenser type and a dispensed product type; and
    a computing device configured to receive the voltage information, the dispenser identification information, the dispenser type, and the dispensed product type, the computing device further configured to identify one of the one or more low battery thresholds based on the dispenser type and the dispensed product type, the computing device further configured to detect a low battery condition if the voltage information satisfies the identified low battery threshold, and
    the computing device further configured to detect a battery replacement event if the voltage information received from the dispenser includes a voltage increase having a predefined change in amplitude and occurring within a predefined period of time.

2. The system of claim 1 wherein the dispensed product type includes one of a liquid, a gel, or a foam.

3. The system of claim 1 wherein the computing device is further configured to determine a number of dispenses remaining based on the received voltage information.

4. A system comprising:
a hand hygiene product dispenser associated with one of plurality of dispenser types and configured to dispense a hand hygiene product, the hand hygiene product dispenser including:
one or more batteries configured to supply power to the dispenser; and
a voltage sensor that senses voltage information correlated to a battery voltage of the one or more batteries;
the hand hygiene product dispenser configured to transmit dispenser data including dispenser identification information associated with the dispenser, the associated one of the plurality of dispenser types, and the voltage information;
data storage media that stores a plurality of low battery thresholds each corresponding to one of a plurality of dispenser types; and
a computing device configured to receive the dispenser data, the computing device further configured to identify one of the plurality of low battery thresholds based on the one of the plurality of dispenser types associated with the dispenser, the computing device further configured to detect a low battery condition if the voltage information satisfies the identified low battery threshold, and
the computing device further configured to detect a battery replacement event if the voltage information received from the dispenser includes a voltage increase having a predefined change in amplitude and occurring within a predefined period of time.

5. The system of claim 4 wherein the one or more low battery thresholds each correspond to a dispenser type and a dispensed product type.

6. The system of claim 5 wherein the computing device is further configured to identify one of the one or more low battery thresholds based on the dispenser type and the dispensed product type.

7. The system of claim 5 wherein the dispensed product type includes one of a liquid, a gel, or a foam.

8. The system of claim 5 wherein the dispensed product type includes one of a sanitizer, a hand soap, a lotion, or an alcohol-based hand hygiene product.

9. The system of claim 4 further comprising generating a low battery condition message if a low battery condition is detected.

10. The system of claim 9 wherein the low battery condition message is one of an electronic mail message, a text message, a voice mail message, an audible indicator, a visual indicator, or in a report.

11. The system of claim 4 wherein the data storage media further stores a plurality of discharge profiles each corresponding to one of a plurality of dispenser types and one of a plurality of dispensed product types, and
wherein, the computing device is further configured to identify one of the plurality of discharge profiles based on the one of the plurality of dispenser types associated with the dispenser and based on the voltage information received from the dispenser over a period of time;
the computing device further configured to identify one of the plurality of dispensed product types corresponding to the identified discharge profile.

12. The system of claim 11 wherein the computing device is further configured to generate a report including the identified one of the plurality of dispensed product types.

13. A system comprising:
a hand hygiene product dispenser including:
one or more batteries configured to supply power to the dispenser; and
a voltage sensor that senses voltage information correlated to a battery voltage of the one or more batteries;
the hand hygiene product dispenser configured to transmit the voltage information;
data storage media that stores one or more low battery thresholds each corresponding to a dispenser type, and that stores a plurality of discharge profiles each corresponding to one of a plurality of dispenser types; and
a computing device configured to receive the voltage information and identify one of the plurality of discharge profiles based on the voltage information received from the dispenser;
the computing device further configured to identify the dispenser type corresponding to the identified discharge profile, and
the computing device further configured to detect a battery replacement event if the voltage information received from the dispenser includes a voltage increase having a predefined change in amplitude and occurring within a predefined period of time.

14. The system of claim 13 wherein the computing device is further configured to identify a low battery threshold based on the identified discharge profile.

15. The system of claim 13 wherein the computing device is further configured to detect a low battery condition if the voltage information satisfies the identified low battery threshold.

16. The system of claim 13 wherein the plurality of discharge profiles each further correspond to one of the plurality of dispenser types and one of a plurality of dispensed product types, and wherein the computing device is further configured to identify the dispensed product type corresponding to the identified discharge profile.

17. A system comprising:
a hand hygiene product dispenser, the dispenser defined by one of a plurality of dispenser types and including:
one or more batteries configured to supply power to the dispenser; and
a voltage sensor that senses voltage information correlated to a battery voltage of the one or more batteries;
the hand hygiene product dispenser configured to transmit dispenser data including the voltage information and dispenser identification information including the defined one of the plurality dispenser types;
data storage media that stores one or more discharge profiles each corresponding to one of the plurality of dispenser types and one of a plurality of dispensed product types; and
a computing device configured to receive the voltage information and the dispenser identification information, the computing device further configured to identify one of the plurality of discharge profiles based on the voltage information and the defined one of the plurality of dispenser types;
the computing device further configured to identify the dispensed product type corresponding to the identified discharge profile, and the computing device further configured to detect a battery replacement event if the voltage information received from the dispenser includes a voltage increase having a predefined change in amplitude and occurring within a predefined period of time.

18. The system of claim 17 wherein the computing device is further configured to identify a low battery threshold based on the identified discharge profile.

19. The system of claim 17 wherein the computing device is further configured to detect a low battery condition if the voltage information satisfies the identified low battery threshold.

20. The system of claim 17 wherein the computing device is further configured to compare the identified dispensed product type with an authorized product type to determine whether the dispensed product type is an authorized product type.

21. The system of claim 20 wherein the computing device is further configured to generate an unauthorized product type message if the dispensed product type is not an authorized product type.

* * * * *